(12) United States Patent
Yadegari et al.

(10) Patent No.: US 11,741,329 B2
(45) Date of Patent: Aug. 29, 2023

(54) LOW POWER NON-VOLATILE NON-CHARGE-BASED VARIABLE SUPPLY RFID TAG MEMORY

(71) Applicant: BEST MEDICAL CANADA LTD., Ottawa (CA)

(72) Inventors: Behzad Yadegari, Ottawa (CA); Steven McGarry, Ottawa (CA); Langis Roy, Whitby (CA)

(73) Assignee: Best Theratronics, Ltd., Ottawa (CA)

( * ) Notice: Subject to any disclaimer, the term of this patent is extended or adjusted under 35 U.S.C. 154(b) by 55 days.

(21) Appl. No.: 17/010,713

(22) Filed: Sep. 2, 2020

(65) Prior Publication Data
US 2021/0097363 A1 Apr. 1, 2021

Related U.S. Application Data

(60) Provisional application No. 62/906,702, filed on Sep. 26, 2019.

(51) Int. Cl.
| | |
|---|---|
| *G06K 19/07* | (2006.01) |
| *G11C 17/18* | (2006.01) |
| *G11C 17/16* | (2006.01) |

(52) U.S. Cl.
CPC ..... *G06K 19/0723* (2013.01); *G06K 19/0701* (2013.01); *G11C 17/16* (2013.01); *G11C 17/18* (2013.01)

(58) Field of Classification Search
CPC .................. G06K 19/0723; G06K 19/0701
See application file for complete search history.

(56) References Cited

U.S. PATENT DOCUMENTS

| | | | |
|---|---|---|---|
| 6,204,764 B1 * | 3/2001 | Maloney | G08B 21/0286 340/568.1 |
| 6,228,715 B1 | 5/2001 | Shimoji | |

(Continued)

FOREIGN PATENT DOCUMENTS

| | | |
|---|---|---|
| CA | 2215369 | 3/1999 |
| CA | 3065746 | 2/2019 |

(Continued)

OTHER PUBLICATIONS

Hickman Susan, "NSERC grant boosts research on tiny sensor with great potential in biomedicine", Available at Carleton Now—http://carietonnow.carleton.ca, Dec. 11, 2013, 1 page.

(Continued)

*Primary Examiner* — Laura A Gudorf

(57) ABSTRACT

Low power non-volatile non-charge-based variable supply RFID tag memory devices and methods for reading and writing predetermined ID values for a RFID tag are described. The RFID tag memory device includes a reference/bias generator that receives and provides voltages and currents for write and read operations, a clocked comparator that provides a voltage comparison with a reference voltage, a shift register that receives a non-charge-based memory component value saved in the shift register, a memory cell that includes non-charge-based memory components to store corresponding predetermined ID values, a ring counter that provides ring signals to enable sequential writing and reading of the predetermined ID values to and from the memory cell, a write decision component that receives ring signals to enable the write operation, an output select/isolation component for reading and a read/write component to enable reading or writing the predetermined ID values in response to received ring signals.

10 Claims, 22 Drawing Sheets

(56) References Cited

U.S. PATENT DOCUMENTS

| | | | |
|---|---|---|---|
| 7,420,524 | B2 | 9/2008 | Werner et al. |
| 7,652,268 | B2 | 1/2010 | Patel |
| 7,831,016 | B2 | 11/2010 | Saoudi et al. |
| 9,531,077 | B1 | 12/2016 | Weller et al. |
| 10,152,667 | B2 | 12/2018 | Gabriel et al. |
| 11,043,729 | B2 | 6/2021 | Roy et al. |
| 2001/0033233 | A1 | 10/2001 | Jentsch et al. |
| 2003/0231142 | A1 | 12/2003 | McKinzie, III et al. |
| 2004/0233043 | A1* | 11/2004 | Yazawa .............. G06K 19/0723 435/6.13 |
| 2010/0096556 | A1 | 4/2010 | Arsalan et al. |
| 2010/0188306 | A1* | 7/2010 | Kitayoshi .............. H01Q 1/085 343/767 |
| 2011/0006878 | A1* | 1/2011 | Nyffeler .............. G06Q 20/3278 340/5.8 |
| 2011/0168920 | A1 | 7/2011 | Yoder |
| 2012/0001235 | A1 | 1/2012 | Fife |
| 2013/0033700 | A1 | 2/2013 | Hallil |
| 2013/0201773 | A1* | 8/2013 | Kim .......................... G11C 7/22 365/189.14 |
| 2013/0292763 | A1 | 11/2013 | Chang et al. |
| 2015/0116093 | A1 | 4/2015 | Swager et al. |
| 2015/0192475 | A1 | 7/2015 | Eisenstadt et al. |
| 2017/0098894 | A1 | 4/2017 | Kawata |
| 2019/0036206 | A1 | 1/2019 | de Rochemont |
| 2020/0251806 | A1 | 8/2020 | Roy et al. |

FOREIGN PATENT DOCUMENTS

| | | |
|---|---|---|
| CN | 201654818 | 11/2010 |
| FR | 2945128 A | 11/2010 |
| WO | 2019035073 A2 | 2/2019 |
| WO | 2019035073 A3 | 6/2019 |

OTHER PUBLICATIONS

P. Padilla De La Torre et al., "Characterization of artificial magnetic conductor strips for parallel plate planar antennas", vol. 50, Issue 2, Microwave and Optical Technology Letters, Dec. 2007, 7 pages.

Toth, Stephen, "An Efficient RF Rectifier for Energy Harvesting Systems with Applications to Wireless Dosimetry", Carleton University, MSc Thesis, 2014, 203 pages.

Yadegari, Behzad, "Low Power Gamma-Ray FG-MOSFET Dosimeter in 0.13 um CMOS Technology", Carleton University, MSc Thesis, 2012, 143 pages.

CMC Microsystems, "University expertise develops X-ray sensor for Canadian Biomedical company", Success Stories, Annual Report, 2013/2014, 3 pages.

Yadegari, Behzad et al., "An Efficient and Compact Wireless Solution for Blood Sterilization Apparatus", ANTEM, Jul. 2018, 3 pages.

CMC Microsystems, "University expertise develops X-ray sensor for Canadian Biomedical company", Impact, Feb. 2014, 1 pages.

PCT International Search Report, PCT/CA2020/051244, Dec. 8, 2020, 5 pages.

PCT Written Opinion of the International Searching Authority, PCT/CA2020/051244, Dec. 8, 2020, 5 pages.

Yadegari, Behzad, "Low Power Wireless CMOS System-on-Chip X-Ray Dosimeter", Carleton University, Doctor of Philosophy Thesis, 2019, 183 pages.

Pejovic et al., "Application of pMOS Dosimeters in Radiotherapy", Chapter 12, Radiotherapy, 2017, 21 pages.

D. Zhang and S. M. R. Hasan, "A New Floating-gate Radiation Sensor and Readout Circuit in Standard Single-Poly 130-nm CMOS Technology," IEEE Transactions on Nuclear Science, vol. 66, No. 7, pp. 1906-1915, Jul. 2019.

U.S. Appl. No. 17/308,668, filed May 5, 2021, Langis Roy et al.

U.S. Appl. No. 17/008,143, filed Aug. 31, 2020, Behzad Yadegari et al.

Examination Report issued in corresponding India Application No. 202247023862, dated Nov. 10, 2022, 7 pages.

Cook et al., "Utilizing Wideband AMC Structures for High-Gain Inkjet-Printed Antennas on Lossy Paper Substrate", IEEE Antennas and Wireless Propagation Letters, IEEE, vol. 12, 2013, pp. 76-79.

Yadegari, Behzad, "Low Power Wireless CMOS System-on-Chip X-Ray Dosimeter", Carleton University, Doctor at Philosophy Thesis, 2019, 183 pages.

* cited by examiner

| INPUT SIGNAL | WRITE OPERATION | READ OPERATION |
|---|---|---|
| RESET | 0→1 | 0→1 |
| READ_CLK | 0→1 | 01 X MANY |
| PULSE_IN | 0→1 | 0→1 |
| WRITE_CLK | 0000(01)X8 0000 (01)X8 0 | 0 |
| DATA_WRITE_ENABLE | 0→1 | 0 |
| DATA | 0000BIT STREAM | 0 |
| C_OF | 22 X 0→1 | 0 |
| $V_{DDH}$ | 3.3 V | 0 |
| $V_{DD}$ | 1.2 V | 0.53 V → 1.2 V |
| GND | 0 | 0 |

FIG. 6

LOW POWER NON-VOLATILE NON-CHARGE-BASED VARIABLE SUPPLY RFID TAG MEMORY

CROSS-REFERENCE TO RELATED APPLICATION

This application claims priority under 35 U.S.C. § 119 to U.S. Provisional Patent Application No. 62/906,702, filed on Sep. 26, 2019, all of which is hereby incorporated herein by reference in their entirety.

1. FIELD OF THE INVENTION

The present invention relates generally to medical sensors, and more particularly, to a low power non-volatile non-charge-based variable supply Radio Frequency Identification (RFID) tag memory device for use in a wireless dosimeter tag for biomedical applications, such as for determination of a radiation dosage.

2. DESCRIPTION OF RELATED ART

The global market for medical sensors has experienced significant growth in recent years and is expected to continue growing at an accelerated rate. In fact, the global market demand for medical sensors is expected to increase more than 50% by the year 2016 compared to 2006. This trend can be attributed to both constant innovation in sensor system design and the proliferation of novel applications for sensors, including X-ray imaging and radiation dosimetry. The latter category refers to sensors which measure X-ray and gamma radiation, also known as ionizing radiation. These sensors are used in a variety of critical procedures, including radiotherapy for cancer treatment and blood irradiation for sterilization. In an effort to minimize costs, the medical industry has expressed growing interest over the use of inexpensive, silicon-based radiation dosimeters, thus defining a new pathway for research in this area to meet the set forth requirements.

Recent research initiatives for biomedical applications have addressed the design of flexible and wearable medical devices for early disease detection and prevention health monitoring and reduction of invasive medical procedures. This has created an increasing demand for flexible, conformal, compact, low-power wireless power transfer (WPT) modules that are easy to fabricate, low-cost and maintain efficient performance on diverse host structures. A number of sensors having a variety of functionalities for the targeted application have been reported in the prior art. These include passive and active circuit designs.

For example, US Patent Application, US2010/0096556A1 to Langis Roy et al., incorporated herein by reference in its entirety, discloses a miniaturized floating gate metal-oxide semiconductor field-effect transistor (FGMOSFET) radiation sensor. The sensor preferably comprises a matched pair of sensor and reference FGMOSFETs wherein the sensor FGMOSFET has a larger area floating gate with an extension over a field oxide layer, for accumulation of charge and increased sensitivity.

Several patents have been issued on color changing indicators, monitors, detectors, and dosimeters for monitoring a variety of biomedical processes. For example, US patent application, US 2011/0168920 A1 to Yoder et al. discloses a device comprising a dosimeter for measuring one or more doses of radiation; and an RFID tag comprising an antenna for communicating with an RFID tag reader and non-volatile memory for storing data therein. This disclosure utilizes an optically stimulated luminescence (OSL) sensor that includes a reference filter material and is used to adjust the dose determined by the reference sensor at very low energies of x-rays or gamma rays.

For example, U.S. Pat. No. 7,652,268 to Patel et al. discloses a general purpose dosimeter reader for determination of a radiation dosage, based on comparison of an image of a treated dosimeter with a series of images of a pre-treated dosimeter. The dosimeter undergoes a color change proportional to the dosage. The sensor may have more than one indicator of the same or different classes. The color change may be a gradual color development or intensification; a gradual color fading; a gradual color change or an abrupt color change.

For example, U.S. Patent Application US2015/0116093A1 to Swager discloses method of detecting a stimulus that can include detecting an output from a radio frequency identification tag including a sensor. The sensor portion is configured to change resistivity when the stimulus contacts or interacts with the radio frequency identification tag, whereby the resistivity change alters the output of the radio frequency identification tag, wherein the radio frequency identification tag includes a carbon nanotube or multiple carbon nanotubes.

For example, the French Patent Application, FR2945128A1 discloses a dosimeter for use during a radiotherapy treatment session, which has a printed circuit board wrapped in an envelope forming material, and a metal-oxide semiconductor field-effect transistor (MOSFET) placed on printed circuit board. A RFID device to identify the dosimeter using an electronic device such as a memory chip containing data and capable of using an antenna to transmit information to a reader is also disclosed. The RFID device may be integrated to the printed circuit board or retrofitted thereon.

One area where such low-power wireless power transfer (WPT) modules may be beneficial is the preparation of blood products for medical applications, such as to prevent the transfusion-associated graft versus host disease (TA-GvHD), where it is imperative that the blood products are irradiated using X-ray or gamma ray sources. The current radiation measurement technology for each blood bag typically relies on radiation sensitive paper tags affixed to each bag that change color when exposed to radiation. The color intensity of the tag indicator corresponds with the radiation duration of which an allowed radiation dose or deposit is typically up to 50 Gray (Gy) of radiation in each blood bag. Using the visual observation of the shade of the color of the tag to deduce the cumulative radiation dose delivered to a blood bag can lead to an erroneous or inaccurate reading or result in that it is typically prone to human judgment. Therefore, a blood bag that has received, based on such visual observation of the paper tag, above the allowed dose, such as 50 Gy, must be discarded, even though in actuality it may have actually have received a radiation dose of 50 Gy or less, resulting in a serious wastage of blood products.

Presently blood products are irradiated in chambers using X-ray or gamma-ray sources to prevent transfusion associated graft versus host disease (TA-GvHD). Typically, blood product irradiation is identified using radiation-sensitive color indicators known as RadTags. Once applied to the blood bags, these labels give positive, visual verification of irradiation provided when a minimum of 25 gray (Gy) has been received. For example, after irradiation, a human operator visually checks the color on each tag to verify that the blood is sufficiently irradiated. However, this nonquantitative approach makes it difficult for a human operator to ascertain whether or not the blood in the blood bag under irradiation has received over 50 Gy, a maximum recommended dosage, thereby resulting in operational and cost inefficiencies. Currently available dosimeters cannot easily be integrated onto ICs for automatic readout; therefore, where many blood bags are being irradiated, it takes time to process all the bags and precision is lost as the operator gets tired. Moreover, rad tags are not reusable, hence increasing the cost of blood sterilization when large quantities are involved.

Previous dosimeter designs have been implemented in an older (thick oxide) CMOS process which is ideal for dosimeter sensitivity, but generally not typically-suited to any form of RF wireless readout, although the thicker oxide can facilitate prevention of charge leakage out of the floating gate of the FG-MOSFET sensor. Moreover, a RFID tag identification (ID), i.e. RFID tag ID, to identify the dosimeter using an electronic device such as a memory chip containing data and capable of using an antenna to transmit information to a reader likewise desirably needs to be designed for use in RF wireless dosimetry. The RFID device or RFID tag ID device needs to be able to be integrated on an integrated circuit chip with a low-power FG-MOSFET radiation sensor, so that the RFID tag ID device can be programmed to identify the object or product irradiated, such as a blood bag, so as to provide an identification of the object or product irradiated for wireless transmission to a reader that reads the RFID tag ID associated with the product or object and reads the transmitted irradiation dose received by the product or object.

It is evident from the current state of art, that current RFID memory tags typically have the aforementioned drawbacks and limitations that are not particularly suitable for a wireless dosimeter and wireless dosimeter radiation measurements.

What is desirably needed, such as for wireless dosimetry measurements and other wireless identification applications, is a low-power or an ultra-low power, variable supply, non-charge based, permanent memory cell that stores an identification bit string therein as an ID, the memory cell being on an integrated circuit chip to be used for identification of the associated chip for wireless transmission and reception related to identification of the chip, such as for identification of a dosimeter tag associated with a product or object being irradiated, such as a blood bag.

Such low power, variable supply, non-charge based, permanent memory cell is crucial or highly desirable to the operation of the RFID dosimeter tag in two ways. First, it is necessary to be able to identify a blood bag from another blood bag. In an irradiator apparatus, there typically can be multiple blood bags close to each other with each having a tag affixed on it. Therefore, it is desirable and needed to be able to identify each blood bag from other blood bags in the irradiator apparatus for tracking purposes to avoid tampering with the blood bags. Second, a low power, variable supply, non-charge based, permanent memory cell is needed and desirable for wireless communication to be able to initiate a command to a specific tag associated with a product or object, such as a corresponding blood bag, to send the radiation data back to the reader. If there is no specific identification of the chips associated with a product or object, for example, once a read data command is sent to the tags, all of them would respond back at the same time causing jamming or possible error in reading back data transmitted, such as the dosimetry data.

Further, what is needed and desirable is an RFID tag ID device that can address challenges faced in designing a robust RFID low power, variable supply, non-charge based, permanent memory cell that can be on an integrated circuit chip for various wireless applications, such as for use in wireless dosimetry tags.

What is further desirable and needed, such as for wireless dosimetry and other applications, is an RFID tag ID device that can have low power operation and operation from a range of supply voltages (~0.5 Volts (V)-1.2 V) of the memory (ID) block, since the RFID tag ID device typically will be powered by wireless RF illumination or a super capacitor as a secondary power source, for example.

What is further desirable and needed, such as for wireless dosimetry and other applications, is an RFID tag ID device that can enable an accurate read operation of the RFID tag ID, as well as an accurate write operation for writing the RFID tag ID, such write operation typically can be done by either the chip manufacturer or the RFID tag supplier, for example.

What is also desirable and needed, such as for wireless dosimetry and other applications, is an RFID tag ID device that can provide for correct operation of the memory, such as presenting the same bit stream, without missing a bit or an incorrect bit read, as well as providing for an acceptable clock spread and comparator layout symmetry.

Additionally, what is desirable and needed, such as for wireless dosimetry and other applications, is an RFID tag ID device that provides for correct operation of the memory block in terms of robustness to variable supply voltage and insensitivity to ionizing radiation, as well as having a shared reference topology in order to increase the sensing robustness while reducing circuit complexity and area that can facilitate less current consumption and, therefore, less power consumption for the RFID tag and memory cell operation, for example.

Further, what is desirable and needed, such as for wireless dosimetry and other applications, is an RFID tag ID device that incorporates an electronic fuse (e-Fuse) memory cell formed in the commercially available 0.13 μm low-cost radio-frequency complementary metal-oxide semi-conductor (RF-CMOS) technology for use in a low power X-ray radiation sensor tag system.

Also, what is desirable and needed, such as for wireless dosimetry and other applications, is an RFID tag ID device that incorporates an e-Fuse memory cell for use in a low power X-ray radiation sensor tag system that does not require higher than a 3.3 V limit for programming, as is typically required for thick gate oxide input/output (IO) transistors for programming, as opposed to an anti-fuse option for the memory cell.

Further, what is needed is a wireless radiation dosimeter that can be fabricated as a low cost semiconductor device, using a commercially available low cost semiconductor process, and that addresses limitations in the currently used technology for radiation measurement, such as wastage of blood, handling errors, and uncertainties of the exact radiation dose received, such as an X-ray dose received.

In this regard, what is needed is a RFID tag ID device for use in a monolithically integrated radiation dosimeter, such as for measuring X-Ray radiation, and that can be manufactured using commercially available, low-cost radio-frequency complementary metal-oxide semi-conductor (RF-CMOS) processes, such as a 0.13 μm RF-CMOS process, for use with a monolithically integrated radiation sensor for use in wireless dosimetry.

Therefore, in view of the foregoing, it would be desirable to have an RFID tag ID device suitable for a wireless dosimeter, or other applications, formed in a monolithic integrated circuit having a non-charge based nonvolatile one-time programmable read-only memory (OTPROM) using the electronic fuse (e-Fuse) offered in the commercially available 0.13 μm RF-CMOS process in conjunction with sensing circuitry designed to operate with relative stability in the supply range of 0.53 V to 1.2 V in a wireless dosimeter, or other applications, that addresses the aforementioned and other drawbacks, needs and limitations.

SUMMARY OF INVENTION

Embodiments of a RFID tag ID device including a low power, variable supply, non-charge based, permanent memory cell that can be formed on an integrated circuit chip in RF-CMOS technology, desirably in a commercially available 0.13 μm RF-CMOS process, for various wireless applications, such as for use in wireless dosimetry tags for a wireless radiation dosimeter are described.

Also, embodiments of a RFID tag ID device including a low power, variable supply, non-charge based, permanent memory cell are described in a monolithic integrated circuit having a non-charge based nonvolatile one-time programmable read-only memory (OTPROM) using the electronic fuse (e-Fuse) offered in a commercially available 0.13 μm RF-CMOS process, such as offered by Global Foundries, in conjunction with sensing circuitry designed to operate with relative stability in the supply range of 0.53 V to 1.2 V in a wireless dosimeter, such as for wireless dosimeter radiation tags that facilitate enabling measuring a relatively exact cumulative dose of radiation received by blood bags, or as RFID tags that can be used in other applications of RFID tags.

Further, embodiments of a RFID tag ID device are described for wireless dosimeter radiation tags that enable the use RF-CMOS technology enabling efficient RF operation in conjunction with their incorporation into an integrated circuit chip structure for a wireless dosimeter.

Although, various components are integral to an embodiment of a dosimeter tag, embodiments of the invention particularly relate to the structure, design, fabrication and properties of a RFID tag ID device for use in a wireless dosimeter tag for radiation measurement including circuitry that can facilitate writing in and reading from a non-volatile memory (NVM) of the RFID tag ID device an identification of a predetermined sequence of bits of a predetermined ID that identify or uniquely identify the RFID tag, such as 8-bit non-charge based nonvolatile one-time programmable read-only memory (OTPROM) using the electronic fuse (e-Fuse) structure.

Embodiments of a low power non-volatile non-charge-based variable supply radio frequency identification (RFID) tag memory device, include a reference/bias generator configured to receive an input voltage and to provide output voltages and currents for a write operation and for a read operation of the RFID tag memory device, the reference/bias generator including a first isolating component to stop high voltages during the write operation from damaging the reference/bias generator, a clocked comparator configured to receive a reference voltage of the provided output voltages from the reference/bias generator for the read operation of the RFID tag memory device, the clocked comparator receiving the reference voltage from the reference/bias generator and a non-charge-based memory component voltage for comparison, the clocked comparator providing a non-charge-based memory component value as a result of the comparison, the non-charge-based memory component value corresponding to a predetermined identification (ID) value of a non-charge-based memory component forming part of a predetermined ID for a RFID tag, a shift register in communication with the clocked comparator and being configured to receive the non-charge-based memory component value as a result of the comparison by the clocked comparator of the reference voltage from the reference/bias generator and the non-charge based memory component voltage which is saved in a register of the shift register corresponding to the predetermined ID value; a system memory component including a memory cell that includes a plurality of non-charge-based memory components, each non-charge-based memory component being configured to be programmed to store the predetermined ID value for a respective non-charge-based memory component; a ring counter configured to provide a plurality of ring signals, each ring signal corresponding to one of the plurality of non-charge-based memory components for writing to and reading from each non-charge-based memory component the predetermined ID value forming the predetermined ID of the RFID tag, the ring signals of the ring counter enabling the sequential writing of each predetermined ID value to a corresponding one of the non-charge-based memory components, a read/write component associated with the system memory component, the read/write component configured to receive the plurality of ring signals from the shift register ring counter and a read current and a write current from the reference/bias generator to read and write the predetermined ID values to and from each non-charge-based memory component corresponding to the predetermined ID of the RFID tag; a write decision component configured to receive the plurality of ring signals from the ring counter -shift register to enable the write operation to write the predetermined ID value to each non-charge-based memory component corresponding to the predetermined ID of the RFID tag, the write decision component being disabled during the read operation of the predetermined ID value stored to each non-charge-based memory component, an output select/isolation component configured to receive the plurality of ring signals from the ring counter and a voltage generated from the read/write component corresponding to the predetermined ID value stored in each non-charge-based memory component of the memory cell, the output/select isolation component in communication with a second isolating component to isolate a high writing voltage during the write operation from being provided to the clocked comparator.

Also, embodiments of a low power non-volatile non-charge-based variable supply RFID tag memory device can also desirably include a third isolating component associated with the memory cell to minimize a voltage drop in programming of the non-charge-based memory components with the corresponding predetermined ID values.

Further, in embodiments of a low power non-volatile non-charge-based variable supply RFID tag memory device the reference/bias generator can desirably include a reference resistor that provides a reference resistance for determining a conducting state or a non-conducting state of a non-charge based memory component, the conducting state or the non-conducting state indicating the predetermined ID value for a corresponding one of the non-charge based memory components.

Additionally, in embodiments of a low power non-volatile non-charge-based variable supply RFID tag memory device each of the non-charge based memory components in the memory cell is desirably an electronic fuse (e-Fuse).

Embodiments of methods are described for writing a predetermined identification (ID) value to each of a plurality of non-charge-based memory components in a low power non-volatile non-charge-based variable supply radio frequency identification (RFID) tag memory device including a system memory, a reference/bias generator, a shift register, a ring counter, a write decision component and a read/write component, including the steps of providing predetermined ID values for each respective non-charge-based memory component of the plurality of non-charge-based memory components in a memory cell of the system memory to be programmed to store the predetermined ID value for a respective non-charge-based memory component.

The methods for the write operation desirably include providing to the reference/bias generator an input voltage and to provide output voltage and current for selectively enabling writing a conducting state or a non-conducting state for each of a plurality of non-charge-based memory components of the memory cell, receiving by the shift register predetermined ID values and saving in corresponding registers of the shift register the non-charge-based memory component predetermined ID values; providing a plurality of ring signals from the ring counter, each ring signal corresponding to one of the plurality of non-charge-based memory components for writing to a corresponding one of the non-charge-based memory components the predetermined ID value forming the predetermined ID of the RFID tag, the ring signals of the ring counter enabling the sequential writing of each predetermined ID value to a corresponding one of the non-charge-based memory components; sequentially receiving by the write decision component associated with the memory cell the plurality of ring signals from the ring counter to selectively enable the write operation to sequentially write the predetermined ID values to the non-charge-based memory components corresponding to the predetermined ID of the RFID tag to store the predetermined ID values in the non-charge-based memory components, the write decision component generating a write decision to selectively enable the write operation to write to a corresponding one of the plurality of non-charge based memory components of the memory cell its predetermined ID value; and sequentially receiving by the read/write component associated with the system memory the plurality of ring signals from the ring counter, the write decision from the write decision component and a voltage and current from the reference/bias generator for the write operation, and the read/write component sequentially writing in response to a write decision from the write decision component the predetermined ID values to each of the non-charge-based memory components corresponding to the predetermined ID of the RFID tag memory device.

Also, embodiments of methods for reading a predetermined identification (ID) value from each of a plurality of non-charge-based memory components in low power non-volatile non-charge-based variable supply radio frequency identification (RFID) tag memory device including a system memory, a reference/bias generator, a clocked comparator, a shift register, a ring counter, an output select/isolation component, and a read/write component are described.

The methods for the read operation desirably include providing to the reference/bias generator an input voltage and to provide output voltage and current for selectively reading one of a conducting state or a non-conducting state written into each of a plurality of non-charge-based memory components of a memory cell of the system memory, providing to the reference/bias generator an input voltage to provide output voltage and current for a read operation to read from the memory cell the stored predetermined ID values for each of the plurality of non-charge-based memory components, providing to a 90 degree phase shifter associated with the clocked comparator a read clock signal to generate by the 90 degree phase shifter a comparator clock signal, providing the generated comparator clock signal from the 90 degree phase shifter to the clocked comparator, providing to the shift register, in response to each corresponding comparator clock signal from the 90 degree phase shifter, shift register clock signals to enable reading into registers of the shift register stored non-charge-based memory component values corresponding to the stored conducting state or the stored non-conducting state of the non-charge-based memory components in the memory cell, receiving by the shift register the shift register clock signals each generated in response to a corresponding read clock signal for the read operation to save in corresponding registers of the shift register the non-charge-based memory component values corresponding to the predetermined ID values, providing a plurality of ring signals from the ring counter, each ring signal corresponding to one of the plurality of non-charge-based memory components for reading the stored conducting state or stored non-conducting state of the non-charge-based memory components corresponding to the predetermined ID values forming the predetermined ID of the RFID tag, the ring signals of the ring counter enabling the sequential reading of each predetermined ID value for each of the non-charge-based memory components to a corresponding register of the shift register, sequentially receiving by the read/write component associated with the system memory the plurality of ring signals from the ring counter and voltage and current for the read operation from the reference/bias generator to enable sequentially reading the predetermined ID values corresponding to the stored conducting state or the stored non-conducting state of the non-charge-based memory components from each of the non-charge-based memory components corresponding to the predetermined ID of the RFID tag, receiving by the output select/isolation component the plurality of ring signals from the ring counter and a voltage generated from the read/write the stored conducting state or the stored non-conducting state of the non-charge-based memory components from the memory cell to provide to the clocked comparator for comparison with a reference voltage to provide corresponding non-charge-based memory component values as a result of the comparison to provide to corresponding registers of the shift register the non-charge-based memory component values for readout from the shift register corresponding to the predetermined ID values corresponding to the predetermined ID of the RFID tag memory device.

These, and other features of the invention, will become more apparent from the following specification and drawings, in which reference is made to the appended drawings, illustrating embodiments of the invention, by way of example only.

DESCRIPTION OF THE DRAWINGS

FIG. 6 shows a table illustrating exemplary input signals from read and write operations for the non-volatile memory (NVM) e-Fuses of the memory cell or fuse cell for embodiments of the RFID tag ID device circuitry of FIG. 4, associated with writing into the NVM memory and reading from the NVM memory the predetermined ID values corresponding to a RFID tag ID, according to the present invention.

Unless otherwise indicated, similar reference characters denote corresponding features consistently throughout the attached drawings.

DETAILED DESCRIPTION

Figure 1:
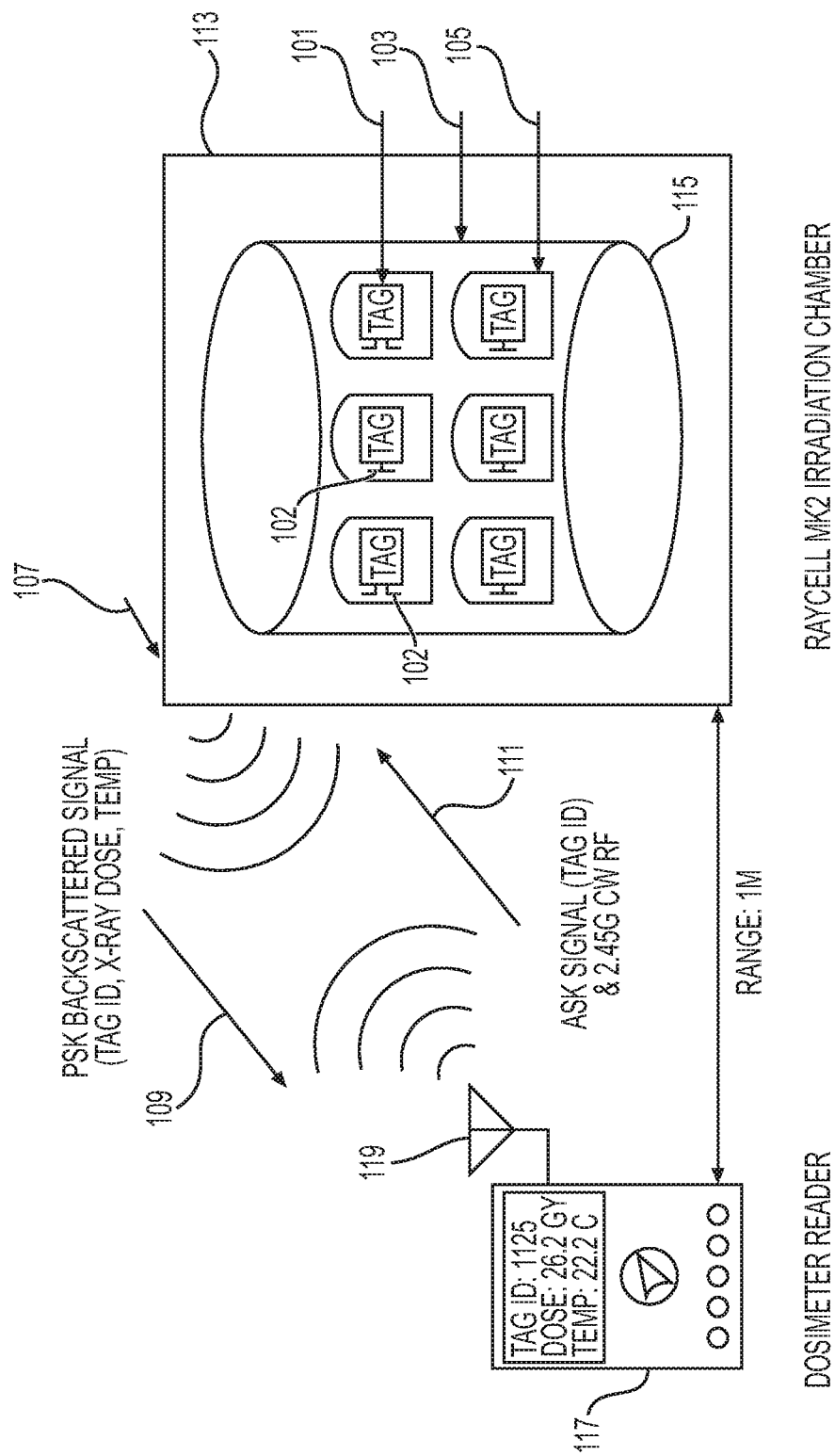
FIG. 1 is a system-level diagram illustrating embodiments of a system and a method for determining an amount of delivered radiation dose to blood bags each associated with a wireless X-ray dosimeter chip-enabled tag having an RFID tag having a predetermined ID corresponding to predetermined ID values of e-Fuses in a memory cell or fuse cell of a RFID tag ID device, according to the present invention.

Embodiments of the disclosure relate to designs and components of RFID tag ID devices in RF-CMOS technology for wireless dosimetry measurements and other wireless identification applications, that include a low-power or an ultra-low power, variable supply, non-charge based, permanent memory cell that stores an identification bit string therein, the RFID tag ID devices including a memory cell, such as of e-Fuses, the RFID tag ID device being on an integrated circuit chip to be used for identification of the associated chip or RFID tag, for wireless transmission and reception related to identification of the RFID tag, such as for identification of a dosimeter tag associated with a product or object being irradiated with which the RFID tag is associated, such as blood in a blood bag. Embodiments of the disclosure also relate to methods for programming, i.e. writing, and for reading the predetermined ID values of the e-fuses of the memory cell or fuse cell of the embodiments of the RFID tag ID device to identify the chip-enabled tag having the RFID tag ID.

The term "irradiation", as is used herein, can include, but is not limited to the conventional meaning of the term "irradiation", i.e., exposure to high energy charge particles, e.g., electrons, protons, alpha particles, etc., or electromagnetic radiation of wave-lengths shorter than those of visible light, e.g., gamma rays, X-rays, UltraViolet, etc.

Further, as used herein, for example, the term "dosimeter" refers to a device used to measure an absorbed dose of ionizing radiation.

Also, as used herein, the term "ionizing radiation" refers to any of various particulate radiation or electromagnetic radiation that is capable of dissociating atoms into a positively and negatively charged ion pair.

In embodiments of the RFID tag ID device, also referred to as a RFID tag memory device, such as the RFID tag ID device 213 (FIG. 2), a NVM design was undertaken in 0.13 µm RF-CMOS to meet the unique wireless dosimeter specifications. Embodiments of the RFID tag ID device included a 8-bit non-charge based nonvolatile one-time programmable read-only memory (OTPROM) using the electronic fuse (e-Fuse) offered in the standard 0.13 µm RF-CMOS with no additional processing overhead mask. The sensing circuitry of the RFID tag ID device is designed to operate stably in the supply range of 0.53V →1.2 V, for example, as can enable the RFID tag ID device to operate correctly even if the supply voltage drops due to unforeseen circumstances or operating off of a super capacitor. Low voltage operation is possible through a supply independent current reference block of the RFID tag ID device setting the current through the reference and each e-Fuse of the memory cell, for example.

Another significant feature of embodiments of the RFID tag ID device, such as the RFID tag ID device 213, is that it facilitates overcoming the challenge of isolating the programming circuit block of the RFID tag ID device, which desirably operates at 3.3 V, from the sensing circuit block of the RFID tag ID device which desirably operates at low voltages using 1.2 V MOSFETs that cannot withstand higher supplies. In such embodiments of the RFID tag ID device, the lowest sensing current of ~114 µA is drawn at a supply of 0.53 V, resulting in a power consumption of 60.42 µW, and the overall area of the memory block or memory cell of the RFID tag ID device desirably is 220 µm×140 µm, for example. Also, in embodiments of the RFID tag ID device, the sensing block desirably utilizes the strong arm latch design which typically only requires a clock signal to pre-charge the line and, instead of passing through each e-Fuse, it passes through the input transistors which desirably facilitate the avoidance of extra metal routing, for example.

A RFID tag and embodiments of the RFID tag ID device, as described herein, are particularly useful for the specific application of a gamma-ray and X-ray dosimeter, such as used in blood irradiation. Typically, it is a common practice to design a non-volatile memory block using charge-based memory bits (floating-gate devices such as flash memory), such as for an operation of the RFID tags where no ionizing radiation present. However, for applications involving the presence of ionizing radiation, such as in blood irradiation, ionizing radiation alters the amount of charge placed on the memory bits to represent each '1' and '0', hence making charge-based memory cells unusable. Therefore, embodiments of non-charge based memory cells are described that use available "e-Fuse" devices, such as offered by the 0.13 µm RF-CMOS technology by Global Foundries, for example. Use of such e-Fuses is advantageous in that they provide a one-time programmable read-only non-charge based non-volatile memory cell which is fixed in dimensions. The e-Fuses work as a variable resistor in that if the e-Fuse is intact, it measures a resistance of around 50 ohms to 150 ohms which can be interpreted as a digital '0', and if it is "burnt" by passing a one-time large current of 10-15 milliamperes (mA), then the e-Fuse is broken and it reads a higher resistance. This higher resistance can be interpreted as a digital '1'. Use of e-Fuses therefore provides for measurements and measurement methods that are robust in that ionizing radiation exposure cannot deter the preset value of the bit to a logic '0' or '1' and it offers the added security in that once the memory bit is written into the e-Fuses, they cannot be changed or tampered with by any user either intentionally or otherwise.

For the readout (sensing) block in embodiments of the RFID tag ID device, a shared reference topology is desirable in order to increase the sensing robustness while reducing circuit complexity and area of the RFID tag ID device, as can be desirable for various applications, such as for a wireless dosimeter chip, for example. Also having one reference can be advantageous in that it facilitates less current consumption which ultimately means less power consumption for the RFID tag ID device, as can be desirable for wireless dosimetry applications.

As for the number of bits for the memory cell of the RFID tag ID device, the embodiments described herein desirably utilized an 8-bit memory for providing predetermined ID values for the predetermined ID, such as for an RFID tag for identifying a plurality of blood bags being or to be irradiated. In embodiments of the RFID tag ID device, the two overall memory block operations are to program (write) and to sense (read) each memory bit (cell). Desirably, when there are eight cells or e-Fuses built into the memory block, there is provided 256 unique combinations of bit patterns for the predetermined ID. The memory can be expandable to more bits for the predetermined ID as needed. Also, in embodiments of the RFID tag ID device, desirably a serial input, serial and/or parallel output configuration is used to design the memory cell block. To write (burn) a '1' in the memory bit, typically a 3.3 V signal for 200 µs or more is required to carry 10-15 mA of current through an e-Fuse. To write a '0', no voltage is applied (the e-Fuse is intact). However, the number of memory bits for providing predetermined ID values for the predetermined ID can be any number of bits, such as provided by e-Fuses, as can depend on the use or application and should not be construed in a limiting sense.

The following examples are provided by way of illustration to further illustrate the exemplary embodiments of a RFID tag ID devices that include a low-power or an ultra-low power, variable supply, non-charge based, permanent memory cell that stores an identification bit string therein, such as for use with an X-ray wireless dosimeter chip-enabled tag for blood bags to uniquely identify or differentiate each blood bag from another blood bag. The RFID tag ID devices can also be used for other applications, such as for vehicle identification, as for toll collection, and product or item identification, for example. However, the embodiments of a RFID tag ID device and associated wireless dosimeter chip-enabled tags can have still other uses or applications, and therefore such examples are not intended to limit its scope or application. Also, the following examples illustrate embodiments of methods for programming and reading a RFID tag ID associated with a RFID tag ID device that includes a low-power or an ultra-low power, variable supply, non-charge based, permanent memory cell that stores an identification bit string therein providing predetermined ID values corresponding to a predetermined ID for a corresponding RFID tag, for example.

FIG. 1 is a system-level diagram illustrating embodiments of a system and a method for determining an amount of delivered radiation dose to blood bags each associated with a wireless X-ray dosimeter chip-enabled tag 101 having an RFID tag ID having the predetermined ID corresponding the predetermined ID values of the e-Fuses in the memory cell or fuse cell of a RFID tag ID device, according to the present invention. In an exemplary embodiment of FIG. 1, there is shown a system-level diagram for determining an amount of a delivered radiation dose to blood in blood bags including the wireless dosimeter chip-enabled tag 101, such as for measuring a radiation dose from X-rays, in communication with a specific blood bag 105, a plurality of blood bags 105 and associated wireless dosimeter chip-enabled tags 101 being illustrated in FIG. 1, housed inside an irradiation apparatus 113, such as a Raycell MK2 Blood Irradiator.

The RFID wireless dosimeter chip-enabled tags 101 are applied to corresponding specific blood bags 105 and the blood bags 105 associated with the RFID wireless dosimeter chip-enabled tags 101 are then placed in an irradiation canister 115 of the irradiation apparatus 113. Each wireless dosimeter chip-enabled tag 101 has an identification (ID) value corresponding to a specific blood bag 105. The irradiation apparatus 113 includes an inner canister 103 that houses the blood bags 105 including the blood to be irradiated. The irradiation canister 115 and the irradiation apparatus 113 can also include an RF opening or portal 107 through which the RFID wireless dosimeter chip-enabled tags 101 through an associated antenna 102 can communicate with a dosimeter reader 117. An amplitude-shift keying (ASK) signal (Tag ID 2.45 GHz RF signal) 111 is transmitted from the dosimeter reader 117 though an antenna 119. The signal transmitted from the dosimeter reader 117, such as a modulated radio frequency signal, contains the predetermined ID corresponding to the wireless dosimeter chip-enabled tag 101 associated with the predetermined ID. After receipt of the signal 111 from the dosimeter reader 117 received by the corresponding antenna 102, a back scattered signal 109 from the corresponding wireless dosimeter chip-enabled tag 101 associated with the predetermined ID containing the information from the respective wireless dosimeter chip-enabled tag 101 is transmitted by the respective antenna 102 and received by the antenna 119 of the dosimeter reader 117. The received back scattered signal 109 containing the information or data corresponding to a specific blood bag 105 is read by the dosimeter reader 117.

The dosimeter reader 117 is placed at a suitable distance from the irradiation apparatus 113, as can depend on the use or application, such as typically at a maximum distance of up to 1 meter (m), from the irradiation apparatus 113, to receive the radiation dosage measured by the wireless dosimeter chip-enabled tags 101 associated with the specific blood bags 105 having the respective predetermined ID values. The dosimeter reader 117 can store or can read out, such as wirelessly through the antenna 119 or through a wired connection, the information or data in the respective received backscatter signals 109 from the corresponding wireless dosimeter chip-enabled tags 101, such as the measured radiation dose respectively applied to blood in the specific blood bags 105, or other applicable data for the blood in the specific blood bag 105, such as the temperature of the blood irradiated, time of irradiation or other applicable information or data, for example.

The exemplary 2.45 GHz X-ray wireless dosimeter chip-enabled tag 101 is intended to replace or is a substitute for the aforementioned color indicator RadTag labels. The 2.45 GHz wireless dosimeter chip-enabled tag 101 is typically used as a semi-passive RFID tag employing backscatter modulation and wireless power transfer to facilitate minimal power consumption and a low-form factor. The wireless dosimeter chip-enabled tag 101 associated with embodiments of the antenna 102 desirably includes an energy harvesting unit, such as a rectifier and a capacitor-for self-powered operation.

Also, embodiments of the wireless dosimeter chip-enabled tag 101 include a suitable wireless X-ray dosimeter chip-enabled tag sensor, such as embodiments of a low-power FG-MOSFET sensor in RF-CMOS technology, which sense the received radiation dosage to the blood bag 105, signal processing electronics, such as a suitable processor and associated memory, that convert measured data to pulses and a transmitter or modulator that sends the pulses through the antenna 102 to the dosimeter reader 117 operating in the same frequency band. Similar to the RadTag labels, the wireless dosimeter chip-enabled tags are to be applied to the blood bags 105 as schematically depicted in FIG. 1. The wireless dosimeter chip-enabled tags 101 desirably are configured to communicate with the RF reader, such as the dosimeter reader 117, typically at a maximum distance of one meter for blood irradiation measurements, for example. Also, it is desirable that power consumption of the wireless dosimeter chip-enabled tag 101 is estimated to consume a power of 263 microwatts ($\mu$W) with a nominal supply of 1.2 volts (V), for example, although the power consumed can depend on the use or application, and should not be construed in a limiting sense.

Figure 2:
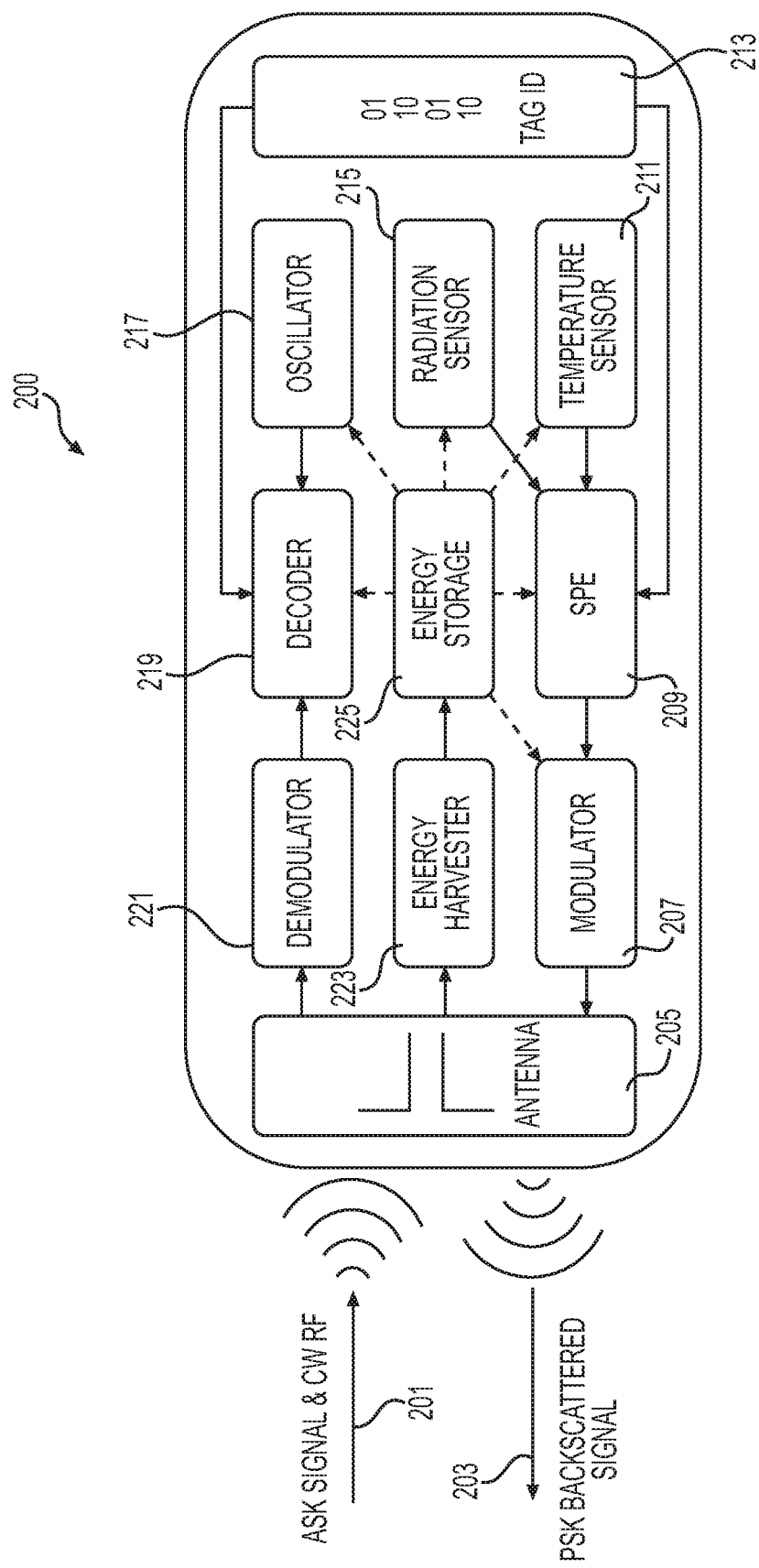
FIG. 2 is a system-level diagram illustrating an embodiment of a wireless dosimeter chip-enabled tag having an RFID tag having an RFID tag ID having the predetermined ID corresponding the predetermined ID values of the e-Fuses in the memory cell or fuse cell of the RFID tag ID device associated with the sub-modules of the wireless dosimeter chip-enabled tag, according to the present invention.

FIG. 2 is a system-level diagram illustrating an embodiment of a wireless dosimeter chip-enabled tag 200 corresponding to the wireless dosimeter chip-enabled tag 101 of FIG. 1. The wireless dosimeter chip-enabled tag 200 has a predetermined ID corresponding to predetermined ID values of e-Fuses in a memory cell or fuse cell of a RFID tag ID device 213 and includes other sub-modules of the wireless dosimeter chip-enabled tag 200. The RFID tag ID device is a necessary circuit block within the RFID tag in that is the memory block which can permanently keep a unique device ID for the wireless dosimeter chip-enabled tag 200. The system-level diagram of a RFID wireless dosimeter chip-enabled tag 200 and its sub-modules, as an exemplary embodiment of the wireless dosimeter chip-enabled tag 101, are desirably implemented in a 130 nanometer (nm) complementary metal oxide semiconductor (CMOS) process, for example, and desirably is integrally formed on an integrated circuit chip, such as a wireless electronic silicon-based dosimeter chip, for example. The dosimeter of the RFID wireless dosimeter chip-enabled tag 200 is realized in a semi-passive RFID (radio frequency identification) tag configuration employing backscatter and a wireless RF energy harvesting module for low-power operation and low-form factor.

The wireless dosimeter chip-enabled tag 200 is uniquely identified by a predetermined ID which is desirably hard-coded into the tag's integrated circuit (IC) in the e-Fuses in a memory cell or fuse cell of the RFID tag ID device 213. The wireless dosimeter chip-enabled tag 200 includes an antenna 205 to receive an ASK signal 201 and to transmit a PSK backscattered signal 203. The ASK signal 201, such as a constant wave radio frequency (CW RF) signal, is transmitted via the antenna 205 to a demodulator 221 to demodulate the received ASK signal 201 and is coupled with a decoder 219 to decode the received ASK signal 201 and an oscillator 217 to generate signals for operation of the wireless dosimeter chip-enabled tag 200. The decoder 219 is in communication with the RFID tag ID device 213, which includes a unique or predetermined ID associated with the wireless dosimeter chip-enabled tag 200, as described herein. The RFID tag ID device 213 is in communication with a signal processing engine (SPE) 209, or other suitable processor, including or associated with a memory for programs, instructions or data storage for operation and control of the wireless dosimeter chip-enabled tag 200, such for processing, transmitting or receiving requests, data or information in or by the wireless dosimeter chip-enabled tag 200. The SPE 209 is coupled to a modulator 207 which modulates and formats an information or data signal, such as the PSK backscatter signal 203, for transmission from the antenna 205 to a receiver, such as to the dosimeter reader 117.

The wireless dosimeter chip-enabled tag 200 further desirably includes a temperature sensor 211 to sense the temperature of an object, fluid or other medium associated with the wireless dosimeter chip-enabled tag 200, such as blood in the blood bag 105 being irradiated, an energy harvester 223 which harvests the energy from the received ASK signal 201 which is in communication with an energy storage module 225 to store the energy from the received ASK signal 201, which is in turn in communication with a low-power FG-MOSFET sensor in RF-CMOS technology radiation sensor 215 that senses an amount of radiation delivered to an object, such as blood in the blood bag 105. The components of the wireless dosimeter chip-enabled tag 200 are communicatively associated with each other through the SPE 209 to perform the functions and operations of the wireless dosimeter chip-enabled tag 200, such as to determine an amount of radiation delivered to the blood bag 105. The wireless dosimeter chip-enabled tag 200 can be modified to perform other applications, as can utilize similar components to those described and additional components for such other applications, for example. To communicate with a specific wireless dosimeter chip-enabled tag 200, a reader, such as the dosimeter reader 117, transmits the ASK signal 201, such as an ultra-high frequency (UHF) 2.45 GHz ASK-modulated signal 201, containing the unique or predetermined ID of the wireless dosimeter chip-enabled tag 200 it wishes to interrogate for data or information, such as the amount of radiation delivered to blood in a specific blood bag 105, for example.

For example, each wireless dosimeter chip-enabled tag 200, such as the wireless dosimeter chip-enabled tag 101 inside the irradiation apparatus 113, such as the Raycell Mk2 irradiator, demodulates the RF signal received through the antenna 205 and compares the received ID to its own unique or predetermined ID. If the IDs match, the wireless dosimeter chip-enabled tag 200 transmits its predetermined ID from the tag ID 213, a sensed X-ray dose from the radiation sensor 215, and measured temperature from the temperature sensor 211 through the antenna 205 to a receiver, such as the dosimeter reader 117, using backscatter modulation. For example, the dosimeter reader 117 establishes a backscatter link by broadcasting a 2.45 GHz CW carrier tone as the ASK signal 201. During uplink communication, the specified wireless dosimeter chip-enabled tag 200 modulates its data, such as radiation, temperature and the predetermined ID value, onto this CW carrier signal using PSK modulation, and reflects the signal as the PSK backscattered signal 203 back to the dosimeter reader 117. Desirably, the interrogations of the wireless dosimeter chip-enabled tag 200, and the transmission and reception communications are carried out using the antenna 205 operating at 2.45 GHz, for example. Examples of a suitable antenna 205 are described in Sansui et al., "Development of a 2.45 GHz Antenna for Flexible Compact Radiation Dosimeter Tags", IEEE Transactions on Antennas and Propagation", Apr. 16, 2019.

Figure 3:
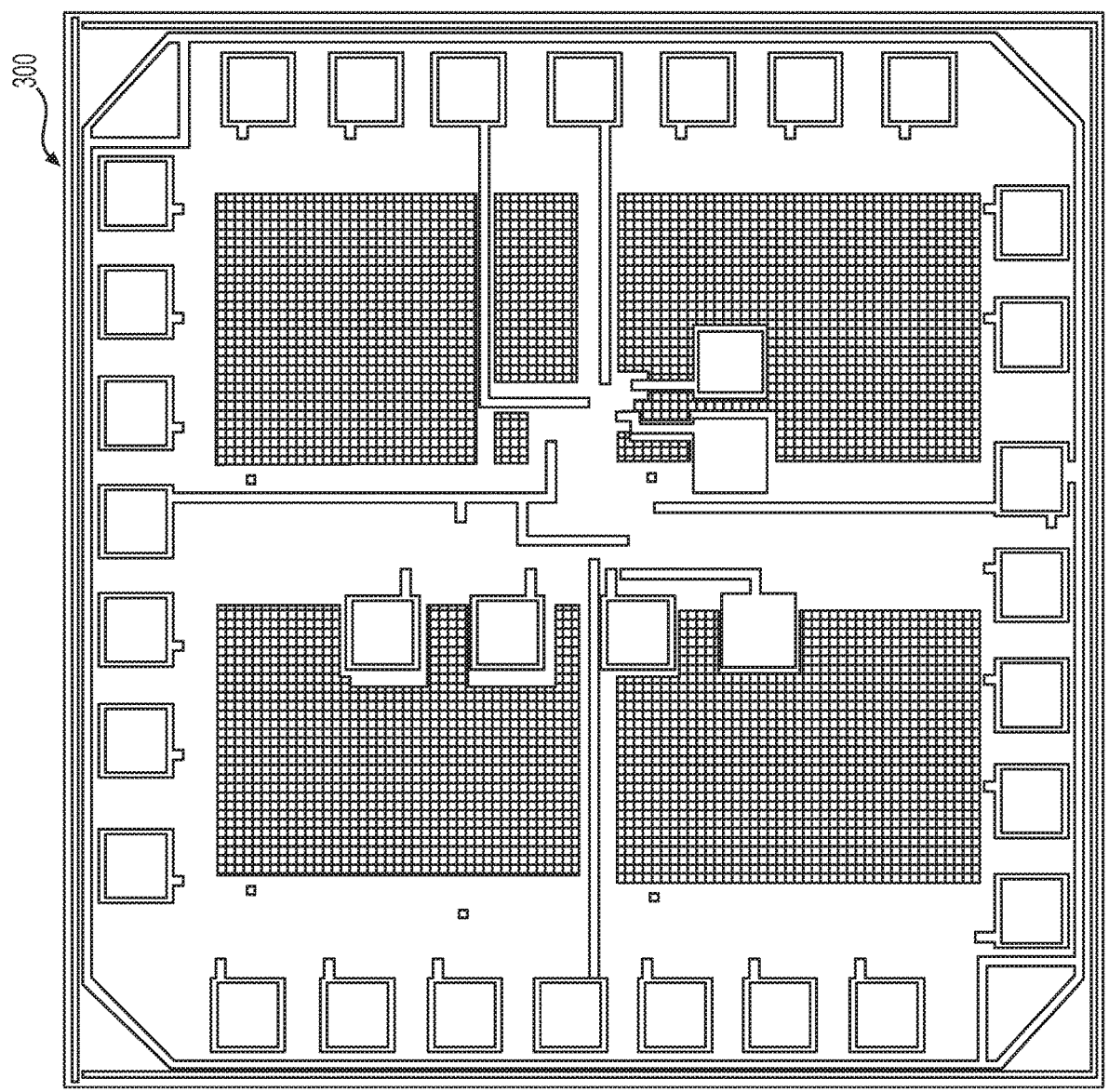
FIG. 3 shows a diagrammatic illustration of an embodiment of the integrated circuit chip for the RFID tag ID device, such as for a wireless radiation dosimeter or other applications, according to the present invention.

FIG. 3 shows a diagrammatic illustration of an embodiment of the integrated circuit chip 300 for the RFID tag ID device 213, such as for a wireless radiation dosimeter or other applications, according to the present invention. The overall memory chip layout for the integrated circuit chip 300, schematically shown in FIG. 3 includes all the input, output and test signal pads. The overall chip integrated circuit chip 300 measures at 1.5 millimeters (mm)×1.5 mm including the bonding pads, which is then incorporated in a wireless dosimeter chip-enabled tag, such as the wireless dosimeter chip-enabled tag 200, for example.

Figure 4:
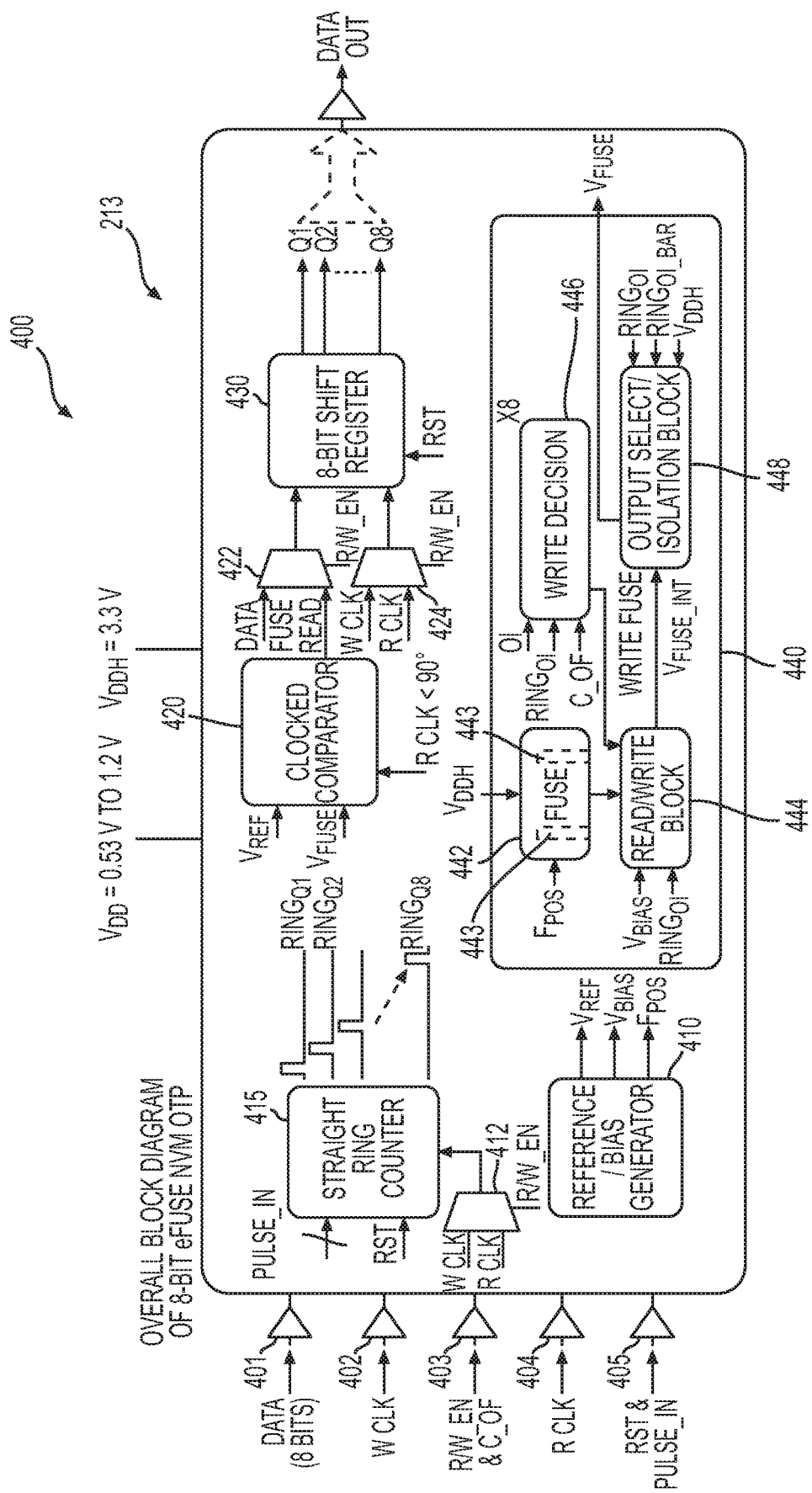
FIG. 4 shows a schematic block diagram of circuitry and a schematic circuit chip layout for embodiments of a RFID tag ID device, such as for a wireless radiation dosimeter, according to the present invention.

FIG. 4 shows a schematic block diagram of circuitry and a schematic circuit chip layout for embodiments of a RFID tag ID device or a RFID tag memory device 400, corresponding to the RFID tag ID device 213, such as for a wireless radiation dosimeter, according to the present invention.

The RFID tag ID device 400 has two major roles within a blood bag irradiation dosimeter system. The first role relates to the necessity to be able to identify a blood bag from another blood bag by the unique bit pattern that each dosimeter tag memory block has saved in it. For example, in an irradiation apparatus, such as the irradiation apparatus 113, there can be multiple blood bags close to each other with each blood bag having a tag affixed on it and it is desirable that each blood bag be required to be identified from each other blood bag for tracking purposes. The second role relates to the necessity to be able to initiate a command to a specific RFID tag to send the radiation data back to the reader for that specific RFID tag. If there is no specific identification for each of the RFID tags, once a read data command is sent to the RFID tags, it is likely all of the RFID tags would respond back at the same time and that likely would cause jamming or possible error in the reading back of the dosimetry data measured or recorded by the RFID tag, for example.

The RFID tag ID device 400 includes a plurality of inputs 401, 402, 403, 404 and 405, indicated in FIG. 4 for the write operation of the predetermined ID values to e-Fuses 443 and the read operation of reading the predetermined ID values of the e-Fuses 443 from the memory cell or fuse cell 442 that provide the predetermined ID for the RFID tag, such as the RFID tag 200, for example.

The RFID tag ID device 400 includes a reference/bias generator 410 that provides currents and voltages as indicated FIG. 4 and FIGS. 5A-5E, 7 and 9 that facilitate minimizing or reducing fluctuations in the on-chip generated useful power which can translate into undesirable fluctuations in the $V_{DD}$ signal. Considering that the RFID tag is designed for wireless operation and powered wirelessly using an external source such as power in a received RF signal, such as from the ASK signal & CW RF 201 signal, fluctuations in the on-chip generated useful power can occur which can translate into fluctuations in the $V_{DD}$ signal. Fluctuations in the $V_{DD}$ signal can typically be detrimental to the correct operation of the memory block of the RFID tag ID device 400. The currents and voltages provided by the reference/bias generator 410 facilitate immunizing the read operation of the e-Fuses 443 in the memory cell or fuse cell 442 against unavoidable fluctuations. Any changes in $V_{DD}$ could result in unpredictable changes mainly in incorrect memory cell reading. For example, if the actual bits which correspond to the predetermined ID values for the predetermined ID are 011001101, then $V_{DD}$ fluctuations could mistakenly read such predetermined ID values in the memory cell or fuse cell as any random value, such as 01000101.

Figure 5A:
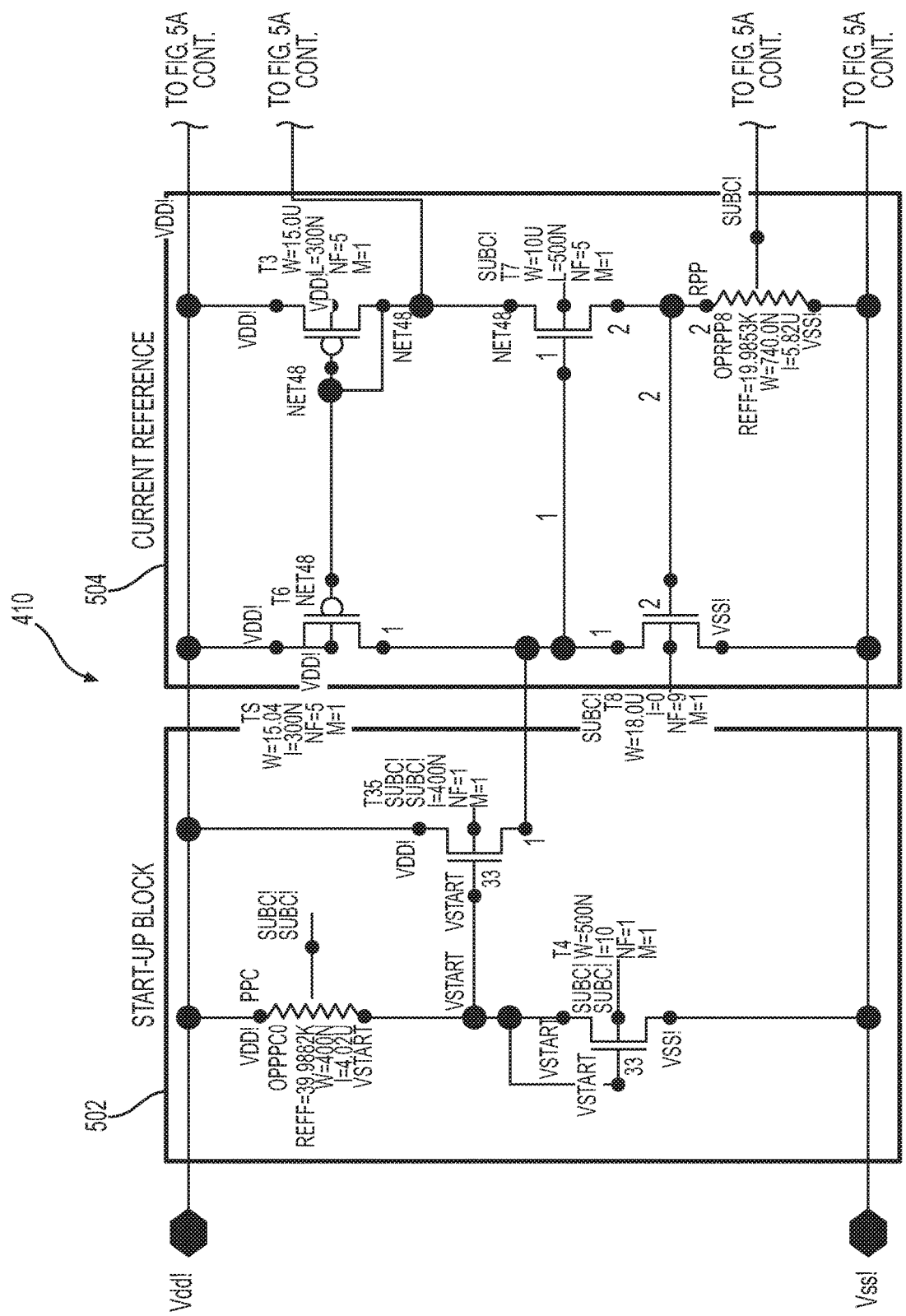
FIG. 5A shows a schematic block diagram of the circuitry for an embodiment of a reference/bias generator of FIG. 4 for embodiments of a RFID tag ID device, according to the present invention.
Figure 5A:
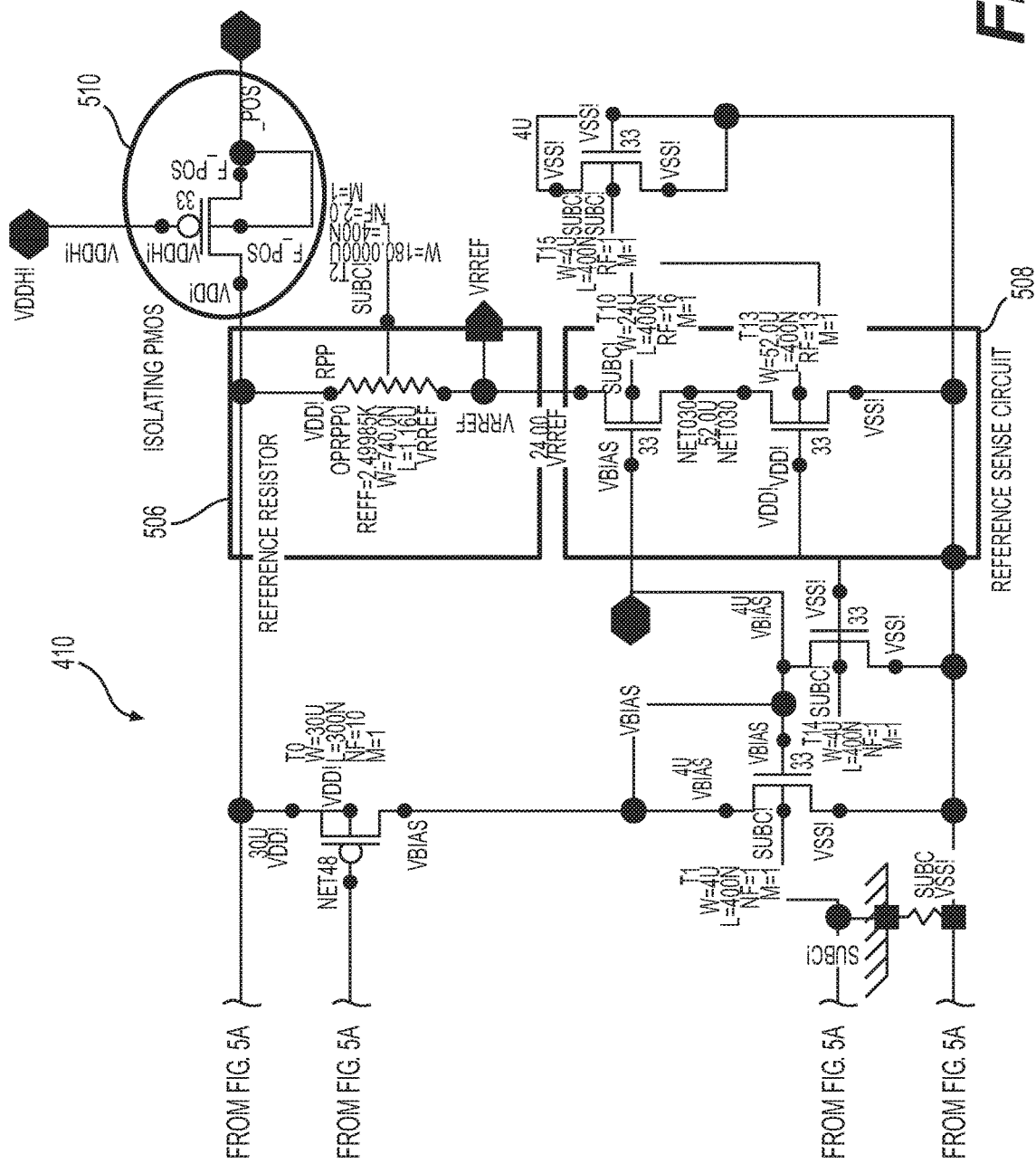

FIG. 5A shows a schematic block diagram of the circuitry for an embodiment of a reference/bias generator 410 of FIG. 4 for embodiments of a RFID tag ID device 400, according to the present invention. The reference/bias generator 410 includes a start-up component block 502 that receives the voltages indicated in FIG. 5A for generation of the voltages and currents for operation of the RFID tag ID device 400. The reference/bias generator 410 also includes current reference component block 504 that provides currents for operation of the RFID tag ID device 400. Further, the reference/bias generator 410 includes a reference sense component 508 circuit that senses the presence of a set reference voltage used in comparing the e-Fuse 443 state with the set reference voltage in order to decide whether the e-Fuse 443 is at a '0' or '1' state, for example, the reference sense component 508 providing the reference voltage to a reference resistor 506.

Also included in FIG. 5A in the reference/bias generator 410 is the reference resistor 506 that provides a reference resistance used in the determination of whether a non-charge based memory component is in a certain state, such as a first state or a second state indicating the predetermined ID value for a non-charge based memory component, such as for the e-Fuse 443 or other suitable non-charged based component, as can depend on the use or application, and should not be construed in a limiting sense. For example, for an e-Fuse 443, if the e-Fuse 443 is blown, in a non-conducting state, or if the e-Fuse 443 is intact, in a conducting state, such conducting or non-conducting state indicates a predetermined ID value for the e-Fuse 443. The reference resistor 506 can provide a resistance to determine if the e-Fuse 443 is intact, and it provides a resistance to measure a resistance of around 50 ohms to 150 ohms which can be interpreted as a digital '0' indicating the e-Fuse 443 is intact, and if it is "burnt", such by passing a one-time large current of 10-15 mA, then the fuse is broken and it reads a higher resistance. This higher resistance can be interpreted as a digital '1'. The reference/bias generator 410 also includes an isolating component, such as an isolating PMOS transistor 510. Isolation of the low voltage "reference/bias generation" block uses the isolating PMOS transistor 510, such as a 100 μm wide MOSFET 'X' (See also FIGS. 7 and 9). Once a voltage $V_{DDH}$=3.3 V is applied, the PMOS 'X' turns off which isolates the "reference/bias generation" block from the high voltage 3.3 V "FPOS" node. The 100 μm PMOS device acts to stop the high voltages during a write operation from breaking and damaging the circuit in the reference/bias generator 410 block.

Continuing with reference to FIG. 5A, in order to minimize-fluctuations of current output with respect to $V_{DD}$ and also to facilitate that $V_{REF}$ and $V_{FUSE}$ do not cross each other, a current reference and bias generator circuit was provided as the reference/bias generator 410. In the reference/bias generator 410 of FIG. 5A, the MOSFETs T3, T7, T8, T6 and resistor OPrpp8 create a current reference circuit for generation of a reference current. The MOSFETs T35, T4, and resistor OPppc0 create a startup circuit. The sizes of these components are desirably adjusted to reduce the current consumption in this part of the reference/bias generator 410 circuit. The reference/bias generator 410 circuit block facilitates minimizing fluctuations of current output with respect to $V_{DD}$ and also facilitate ensuring that $V_{REF}$ and $V_{FUSE}$ do not cross each other. The choices made in the MOSFETs in the reference/bias generator 410 circuitry also are such to facilitate minimizing the ionizing radiation effect on the circuit components, such as by desirably using regular "thin" oxide MOSFETs where needed and using "thick" oxide transistors elsewhere. The thick oxide MOSFETs are noted with "33" beside each MOSFET in FIG. 5A. In the reference/bias generator 410, regardless of the supply voltage change $V_{DD}$, the voltages $V_{REF}$ and $V_{FUSE}$ are therefore able to desirably stay separated from each other, as is desirable for use in RF wireless dosimeter applications, for example.

As shown in FIG. 5A, the isolating PMOS 510 cuts off the 3.3 V supply from the low voltage side during programming of the e-Fuses 443 of the fuse cell or memory cell 442. For sensing (reading) of the e-Fuses 443, as $V_{DDH}$ is grounded, $V_{DD}$ is connected through another isolating component, an isolating PMOS transistor 407 (FIG. 5C) to the e-Fuses 443, the PMOS transistor 407 being a programming transistor in the programming of the e-Fuses 443. The size of this isolating transistor, such as the isolating PMOS 407, is desirably chosen to minimize the voltage drop across its drain source. A transmission gate (i.e. an NMOS in parallel with the isolating PMOS 407) is not used in that the aim of the design of the reference/bias generator 410 is to operate independent of a 3.3 V signal during the sensing or reading operation which relies on the on-chip generated voltage, such as is desirably utilized for wireless dosimetry applications of an RFID tag, for example.

For the read operation, the reference/bias generator 410 receives the $V_{DD}$ in the range of 0.53 V to 1.2 V, for example, and outputs three signals. A first signal $V_{REF}$ is used to compare the e-Fuse 443 state with a set reference voltage in order to decide whether the e-Fuse 443 is at a '0' or '1' state. A second signal $F_{POS}$ is provided to a system memory component block 440 of the RFID tag ID device 400 that includes the fuse cell or memory cell 443 that includes the e-Fuses 443, and the signal $V_{FUSE}$ is the fuse voltage coming out of the system memory component block 440. A third signal $V_{BIAS}$ is provided that goes into a read/write component block 444 of the system memory component block 440 to enable the reading operation of the predetermined ID values of the e-Fuses 443. Also, the signal $V_{BIAS}$ goes specifically to NMOS transistor B in the read/write component block 444 (FIG. 9) for the read operation. Also, the signal $F_{POS}$ is the line feeding the supply voltage and the read current to each of the 8 e-Fuses 443, and the signal $F_{POS}$ voltage is desirably at $V_{DD}$ for the read operation, for example.

The RFID tag ID device 400 also includes a straight ring counter 415 that provides a plurality of ring signals, such as the ring signals RingQ1 to RingQ8, the ring signals RingQ1 to RingQ8 respectively corresponding to each of the eight e-Fuses 443 for reading or writing the corresponding predetermined ID value to the corresponding e-Fuse 443 for the predetermined ID of the RFID tag, such as the for the wireless dosimeter chip-enabled tag 200, for example. The straight ring counter 415 facilities an orderly and accurate writing of the bits, or predetermined ID values, for the e-Fuses 443, since it is not possible to write all the bits in the e-Fuses 443, such as 8 bits corresponding to 8 e-Fuses in the memory cell or fuse cell 442, at the same time. The straight ring counter 415 is operated by the R CLK signal received by a gate 412, the R CLK signal generating the ring signals RingQ1 to RingQ8.

The "R CLK" or "Read CLK" is desirably integrated onto the RFID tag ID device chip 400 or can be integrated into the wireless dosimeter chip-enabled tag 200, for example, such as to provide clock signals for operation of the wireless dosimeter chip-enabled tag 200. A circuit block which can be implemented to perform the read clock task can be in the form of a ring oscillator which takes up a very small space on the chip and consumes an ultra-low amount of power compared to the rest of the circuit. The frequency of the read clock can be in the range of 10's of MHz, for example. The amplitude of the read clock signal is desirably in the range of 0.53 V to 1.2 V. The lower the amplitude the slower the speed and also the power consumption would be lower. Also, for radiation sensing, the speed of the read clock does not have to be so high since radiation sensing does not require nanoseconds of resolution. However the speed and design of the read clock can depend on the use or application of the RFID tag ID device 400, and should not be construed in a limiting sense.

In relation to a desirable feature of the straight ring counter 415 in the RFID tag ID device 400, it is important to note that if in the worst case scenario, all the bits of the e-Fuses in the memory cell to be written are to be 1's, as in 11111111, then that means if these bits were to be written in parallel, all the e-Fuses typically would receive 10-15 mA of current simultaneously, which can likely damage the chip and would also mean that the transistors 'Y' and 'W' (See FIGS. 5A-5D, 7 and 9) would likely be unrealistically large which would consume space on chip for the RFID tag ID device 400 as would likely add to the cost of the production. However, by using the ring counter 415, the number of bits in the memory design does not change any design parameters, namely the size of the transistors 'Y' and 'W', for example, thereby facilitating the adaptability for expansion, such as in relation to the memory cell and the number of e-Fuses 443, for example.

The RFID tag ID device 400 also includes the gate 412 that receives and provides read and write clock signals in response to read/write enable signals as indicated in FIG. 4 to the straight ring counter 415 and to an 8 bit shift register 430 through a gate 424 for the reading and writing operation of the e-Fuses 443 in the memory cell or fuse cell 442.

The RFID tag ID device 400 includes the system memory component block 440 that includes the fuse cell or memory cell 442 that includes the e-Fuses 443. The memory system component block 440 also includes a read/write component block 444, an output select/isolation component block 448 and a write decision component block 446. Embodiments of components of the system memory component block 440 and their function and operation are further illustrated in FIGS. 5A-5E, 7 and 9, for example.

Figure 5B:
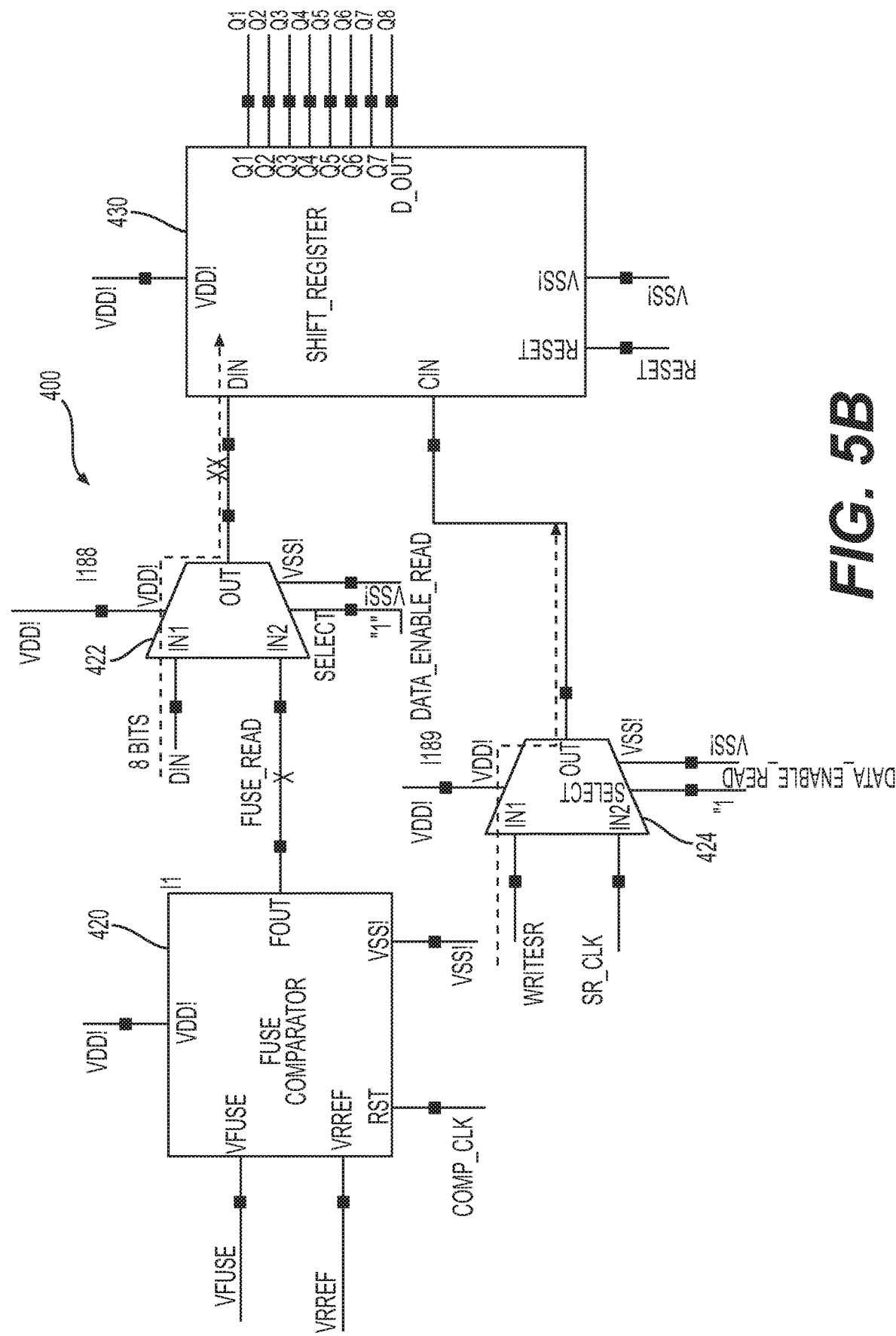
FIG. 5B shows a schematic block diagram of the circuitry for an embodiment of a clocked comparator and shift register in communication with gate circuitry of FIG. 4 for reading in a bit data pattern to the registers to be written to the e-Fuses of a memory cell or fuse cell for embodiments of a RFID tag ID device, according to the present invention.
Figure 5C:
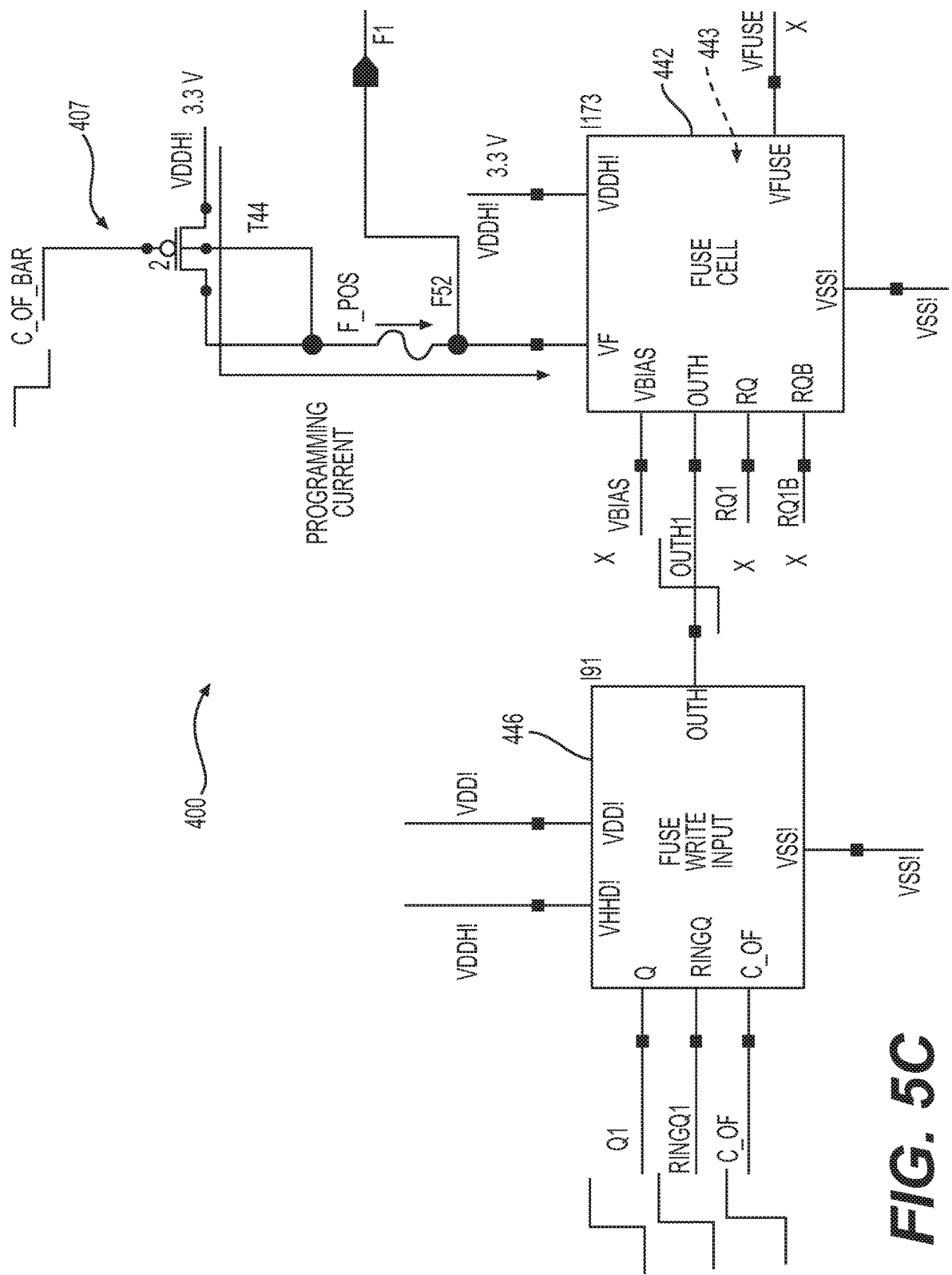
FIG. 5C shows in more detail a schematic block diagram of an embodiment of the circuitry for an e-Fuse programming system block component of FIG. 4 including write decision circuitry in communication with the e-Fuses of the memory cell or fuse cell in for embodiments of a RFID tag ID device, according to the present invention.
Figure 5D:
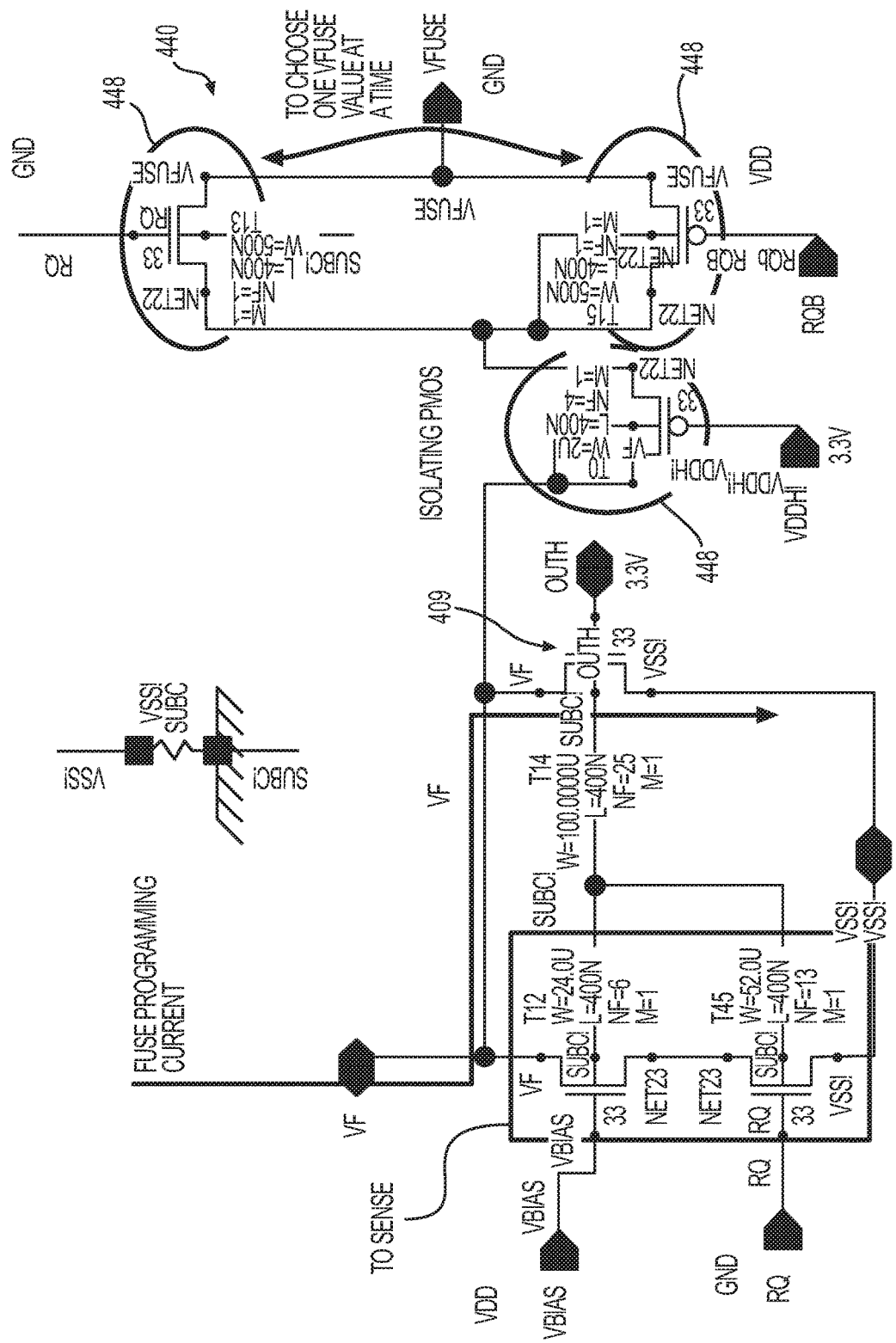
FIG. 5D shows a schematic block diagram of an embodiment of the circuitry for components of a memory system component block for an output select/isolation component block for embodiments of a RFID tag ID device, according to the present invention.

FIG. 5D shows a schematic block diagram of an embodiment of the circuitry for components of the memory system component block 440 of FIG. 4 for the output select/isolation component block 448 circuitry for embodiments of the RFID tag ID device 400, according to the present invention. FIG. 5D illustrates the memory system component block 440 and the circuitry associated with controlling sensing, or reading, and programming of the e-Fuses 443 of the memory cell or fuse cell 442, and illustrates the programming current path and signal conditions for the sensing and programming operations, for example.

FIG. 5D illustrates signal values in the case of programming an e-Fuse 443. Qi is any data bit passed to the registers, such as an 8-bit shift register 430 of the RFID tag device 400; RingQ1 is the output of the straight ring counter 415 that starts up after the first 8 clock cycles. The counter's "1" output rotates through the e-Fuse cells 443 one at a time. In other words, the e-Fuses 443 can only be written in series due to a large amount of current needed to program a fuse. The size of the program NMOS has been determined in order to pass a large current and the routing metals connecting this MOSFET to the e-Fuse 443 and to the supply (3.3 V) and to ground have also been sized as per layout rules in order to avoid any electro-migration or ground lifting, or voltage drop along them. The signal COF is the program enable signal which is set "High=3.3V" for programming and "Low=0 V" for sensing. As illustrated in FIG. 5D, another isolation component, such as an isolating PMOS indicated at the numeral 448, is placed between the output select/isolation component block 448, a sense/program circuit block, and the $V_{FUSE}$ output to a clocked comparator 420 of the RFID tag ID device 400 to protect the clocked comparator 420's input from the high voltages resulting from the programming step of programming the e-Fuses 443. The transmission gate only turns ON to sense the e-Fuses 443 one at a time. The $V_{FUSE}$ line is shared among the e-Fuses 443 and the e-Fuses 443 need to be isolated from that line and only one value is loaded onto the line at a time.

As mentioned, the RFID tag ID device 400 of FIG. 4 includes the clocked comparator 420 that communicates signals with a gate 422, and the gate 422 provides signals of the RFID tag ID device 400, as indicated in FIGS. 4 and 5B, to the 8 bit shift register 430 for the reading and writing operations of the e-Fuses 443 in the memory cell or fuse cell 442. Also, read/write enable signals for the read and write operations, as indicated in FIGS. 4, 5B and 5E, 7 and 9, are provided to the gates 422 and 424 in relation to providing values corresponding to predetermined ID values to or from the 8 bit shift register 430 for the reading and writing operations of the e-Fuses 443 in the memory cell or fuse cell 442. The shift register 430 provides the signals Q1 to Q8 for individually and respectively writing and reading the predetermined ID values for the predetermined ID of a RFID tag, such as the wireless dosimeter chip-enabled tag 200, for example.

FIG. 5B shows a schematic block diagram of the circuitry for an embodiment of a clocked comparator 420 and shift register 430 of the RFID tag ID device 400 in communication with gates 422 and 424 circuitry of the RFID tag ID device 400 of FIG. 4 for reading in a bit data pattern to the registers to be written to the e-Fuses 443 of the fuse cell or memory cell 442 for embodiments of the a RFID tag ID device 400, according to the present invention. Programming an e-Fuse within this technology requires a ~3.3 V supply and ~10-15 mA of DC current for a duration of ≥200 microseconds (μs). FIG. 5B shows the first 8 clock cycles that pushes the 8 bit data pattern to the registers before being written in the next 8 clock cycles and illustrates the reading in the 8 bit data pattern to the registers of the shift register 430 to be written to the e-Fuses 443. FIG. 5B further indicates in more detail the circuitry and signals to and from the clocked comparator 420, the gates 422 and 424 and to and from the shift register 430 in response to read/written enable signals for the reading and writing operations of the e-Fuses 443 in the memory cell or fuse cell 442.

Figure 5E:
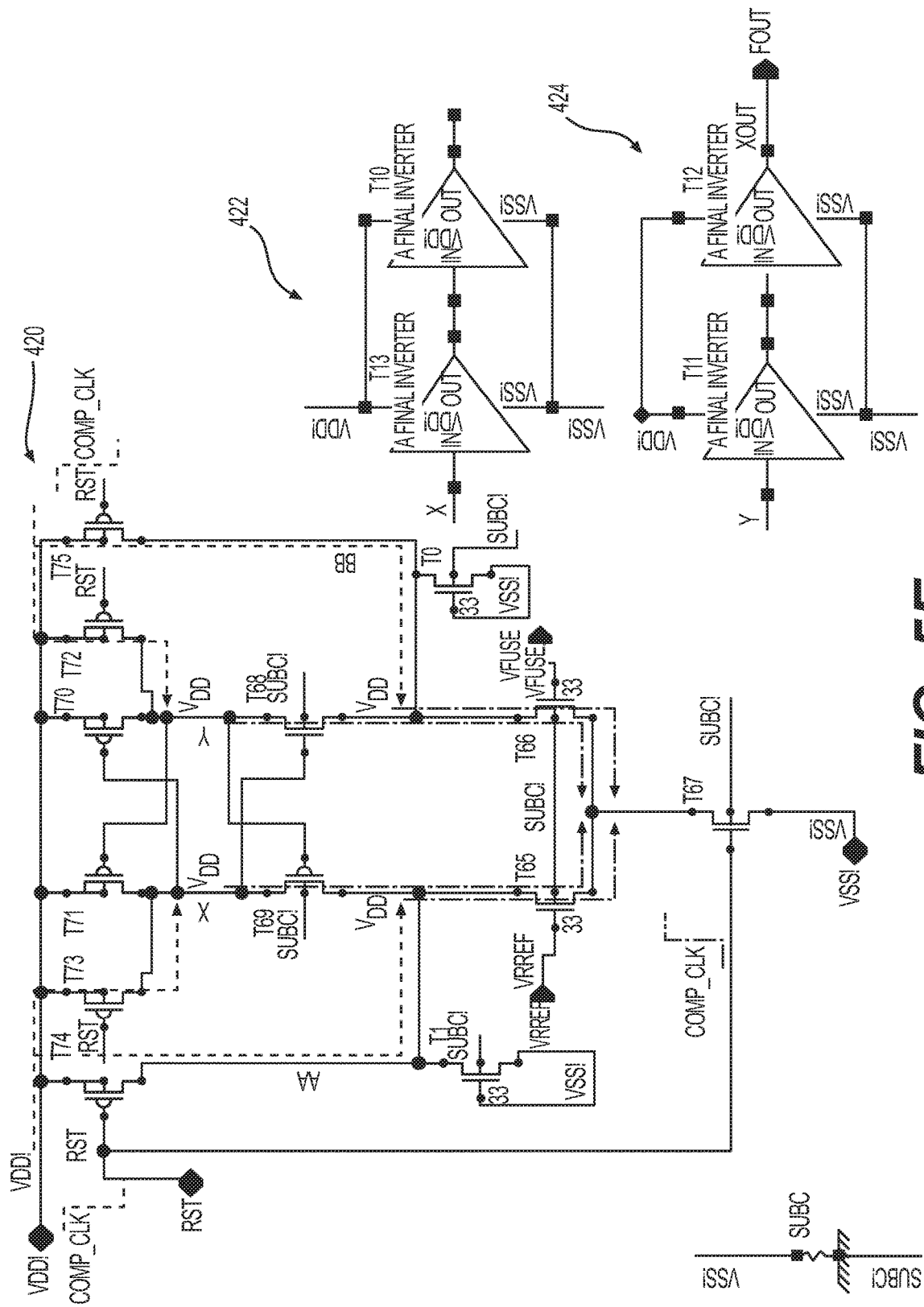
FIG. 5E shows a schematic block diagram of the circuitry for an embodiment of a clocked comparator of FIG. 4, such as a clocked strong arm latch comparator for sensing the predetermined ID values of the e-Fuses of the memory cell or fuse cell in reading out the predetermined ID values for the corresponding e-Fuse for embodiments of a RFID tag ID device, according to the present invention.
Figure 5F:
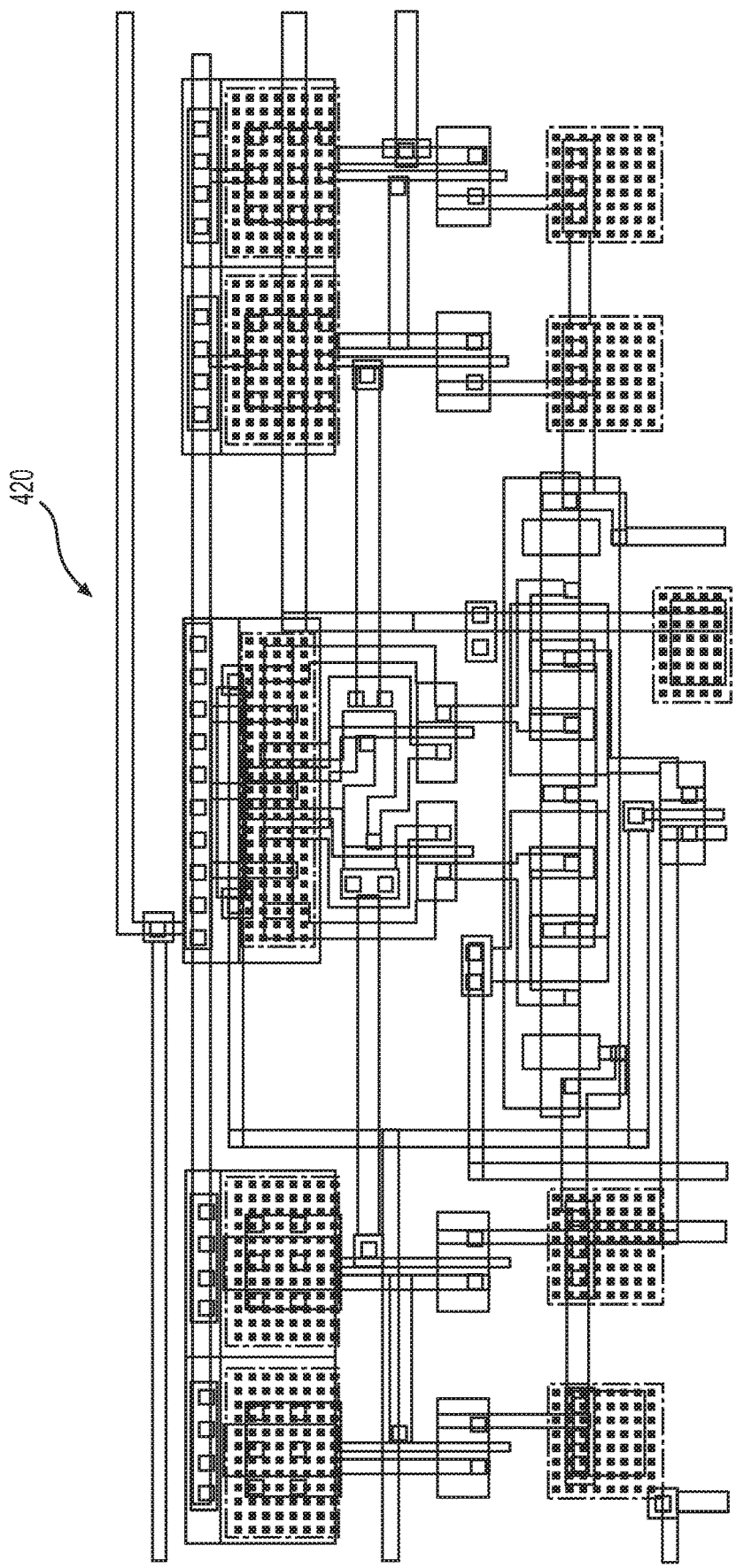
FIG. 5F shows a schematic block diagram of circuitry and a schematic circuit chip layout for an embodiment of the clocked comparator of FIG. 4, such as a clocked strong arm latch comparator of FIG. 5E, for embodiments of a RFID tag ID device, according to the present invention.

FIG. 5E shows a schematic block diagram in further detail of an embodiment of the clocked strong arm latch comparator 420 and the gates 422 and 424 and the circuitry and signals to and from the clocked comparator 420 and the gates 422 and 424 for sensing the predetermined ID values of the e-Fuses 443 of the fuse cell or memory cell 442 in reading out the predetermined ID values for the corresponding e-Fuses 443 for embodiments of a RFID tag ID device 400, according to the present invention. FIG. 5F shows a schematic block diagram of circuitry and a schematic circuit chip layout for an embodiment of the clocked comparator 420 of FIGS. 4, 5B and 5E for embodiments of a RFID tag ID device 400, according to the present invention.

The read/write component block 444 receives the ring signals RingQ1 to RingQ8 from the straight ring counter 415 and the read current and write current from the reference/bias generator 410 to provide for reading and writing the predetermined ID values to and from the e-Fuses 443 corresponding to the predetermined ID of the RFID tag, such as the RFID wireless dosimeter chip-enabled tag 200. The read/write component block 444 receives the voltage $V_{BIAS}$ from the reference/bias generator 410 to provide a voltage to an output select/isolation component block 448 of the system memory component block 440. The output select/isolation component block 448 receives the ring signals RingQ1 to RingQ8 along with the voltage generated ($V_{FUSE\_INT}$) from the read/write component block 444 provided from the voltage $V_{BIAs}$ in relation to the reading of each e-Fuse 443 of the memory cell or fuse cell 442. Then the voltage generated ($V_{FUSE\_INT}$) gets transferred through the output select/isolation component block 448 which creates $V_{FUSE}$. In each read clock cycle, the voltage of one of the e-Fuses 443 (bits) is reflected on the $V_{FUSE}$ line which gets compared to the $V_{REF}$ through the clocked comparator 420 of the RFID tag ID device 400, and a signal is generated (Fuse Read, FIG. 5B), which is saved in the registers of the 8-bit shift register 430 of the RFID tag ID device 400.

Continuing with reference to FIGS. 4 and 5C, an embodiment of an e-Fuse programming system block including read/write control circuit blocks including the write decision component block 446 and the fuse cell or memory cell 442 are illustrated of the memory system component block 440 of the RFID tag ID device 400, with FIG. 5C showing in more detail a schematic block diagram of an embodiment of the circuitry for an e-Fuse programming system block components of FIG. 4. The write decision component block 446 ("Fuse Write Input" block) receives and provides the signals indicated in FIGS. 4 and 5C for the write operation to write the predetermined ID values to the e-Fuses 443 of the fuse cell or system memory 442.

Continuing with reference to FIGS. 4 and 5C, in the operation of the read/write control circuit blocks including the write decision component block 446 in writing the predetermined ID values to the e-Fuses 443 of the fuse cell or memory cell 442, the three signals Qi, RingQ1, and COF need to be "High" in order for the level shifter inside the write decision component block 446 ("Fuse Write Input" block) to output a "High=3.3 V" signal to enable a programming NMOS transistor 407 to provide the programming current. Then the programming current flows as shown in FIG. 5C and FIG. 5D, for example.

Figure 9:
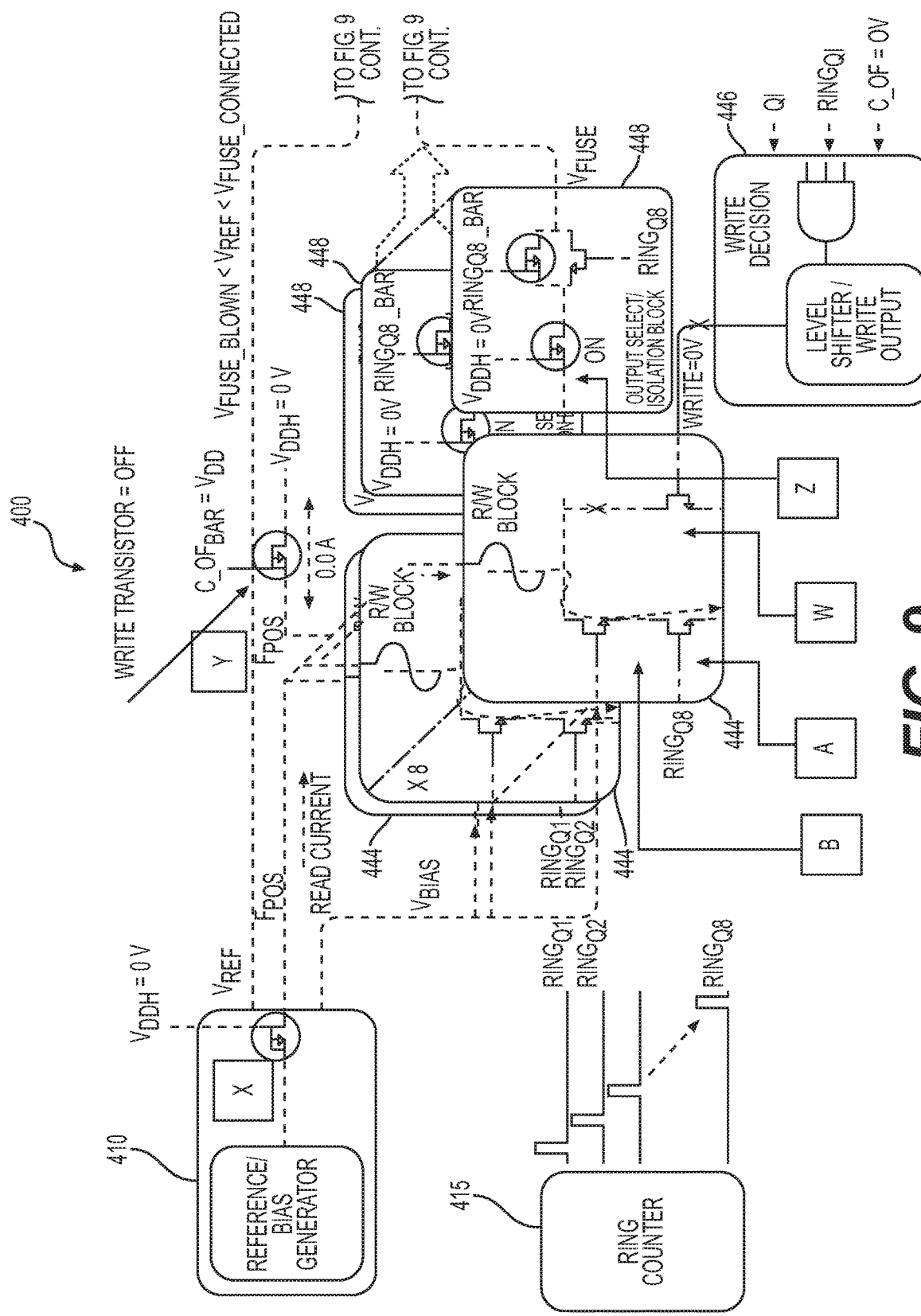
FIG. 9 shows a schematic block diagram of circuitry and a schematic circuit chip layout for embodiments of a RFID tag ID device of FIG. 4 illustrating circuitry associated with and embodiments of methods for a read operation for the non-volatile memory (NVM) e-Fuses of the fuse cell or memory cell for reading from the NVM memory the predetermined ID values corresponding to a RFID tag ID, according to the present invention.
Figure 9:
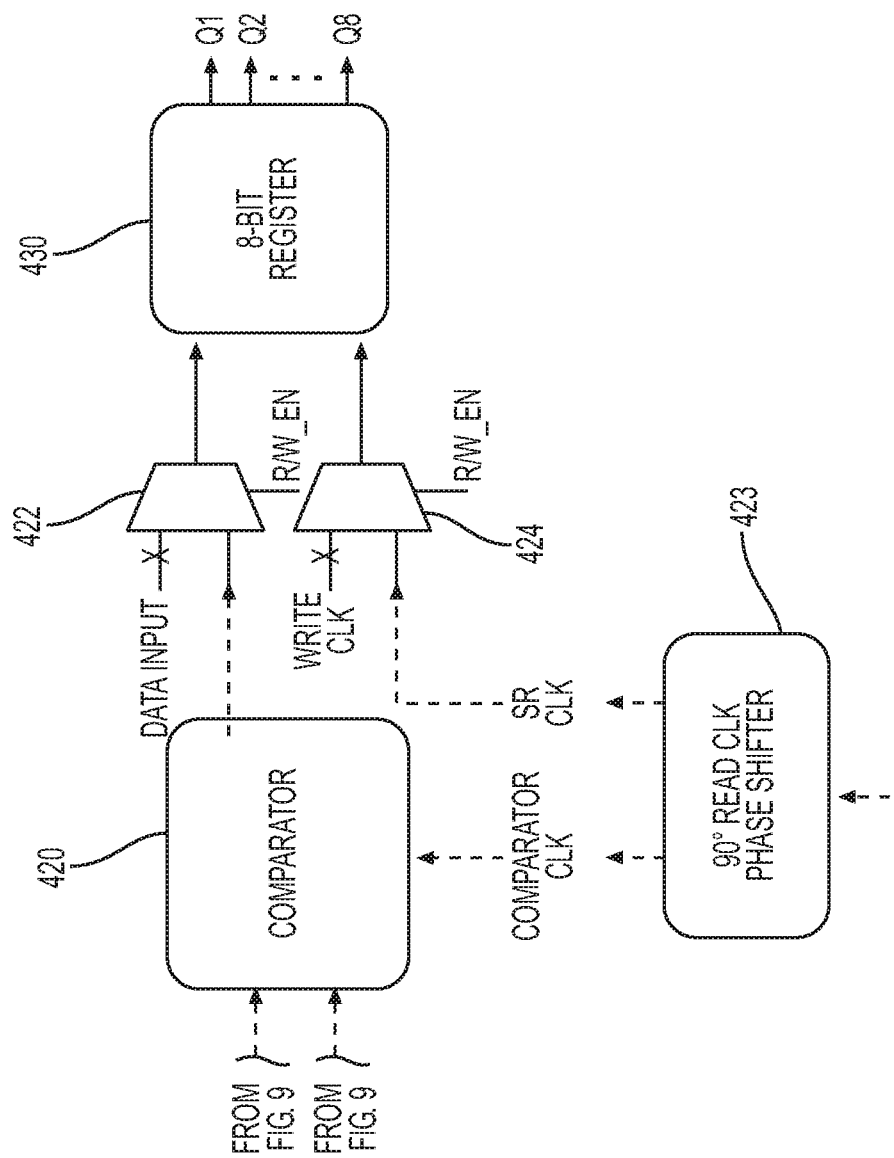

An "un-burnt" e-Fuse measures ~50 Ω to 150 Ω and a burnt one measures ~4,000 Ω. Therefore, the e-fuse memory cell 442 requires a write circuitry that burns each e-Fuse 443 by applying a high-voltage (~3.3 V) and a large current (~10-15 mA) for programming the e-Fuses 443 and also a low power sense circuitry, such as for the read/write component block 444, that reads the bit string produced by the combination of burnt and unburnt e-Fuses 443 (FIG. 9). The application of 3.3 V to each e-Fuse 443 cell requires the use of the high-voltage (3.3 V) variation of transistors for the write stage since, standard transistors, as typically used, cannot withstand such high voltages, for example. Also, during the read operation of the e-Fuses 443 of the fuse cell or memory cell 442, the write decision component block 446 is completely off, such as indicated in FIG. 9.

FIG. 6 shows a table 600 illustrating exemplary input signals from read and write operations for the non-volatile memory (NVM) e-Fuses 443 of the fuse cell or memory cell 442 for embodiments of the RFID tag ID device 400 circuitry of FIG. 4, associated with writing into the NVM memory and reading from the NVM memory the predetermined ID values corresponding to a predetermined ID of a RFID tag, according to the present invention.

The overall read/write operations in reading and writing of the RFID tag predetermined ID to the e-Fuses 443 of the memory cell or fuse cell 442 of the RFID tag ID device 400 desirably requires 8 input signals (pads) and 2 supply pads for $V_{DD}$ and ground, such as generally illustrated in the integrated circuit chip 300 for the RFID tag ID device, with the input signals being indicated in FIGS. 4, 5A-5E, 7 and 9, for example. Table 600 shows the input signals for the read and write operations of the e-Fuses 443 of the memory cell or fuse cell 442 of the RFID tag ID device 400.

Referring to table 600, the Reset signal is used to clear any possible bit values from the registers of the 8-bit shift register 430 and also is a necessary signal in conjunction with Pulse in signal to start the straight ring counter 415. The Read clk signal is used for reading out of the memory bit pattern of the predetermined ID values of the e-Fuses 443 from the memory cell or fuse cell 442. The Read clk signal is to be generated on chip through the use of a ring oscillator of the straight ring counter 415 or any other clock generator block. The operating voltage of the Read clk signal desirably matches the read operation supply range of 0.53 V to 1.2V for example. Through the use of a phase shifter 423 (FIG. 9) and a frequency divider the Read clk signal is divided and two signals are generated which are the Comp clk (Comparator CLK) signal and the SR clk signal. The Comp clk signal is the comparator clock for the comparator 420 and the Comp clk signal arrives earlier than the SR clk signal. The Comp clk signal pre-charges the nodes to $V_{DD}$ on the falling edge as shown in FIG. 5E. On the rising edge of this clock, the evaluation period starts where a decision is made based on the input values to the differential pair, for example.

Continuing with reference to table 600, The Pulse in signal has the task of starting the straight ring counter 415, which carries a logical "1" through the eight (8) ring signals to the read/write component block 444, in the starting of the writing of the predetermined ID values to the e-Fuses 443; and the outputs of the straight ring counter 415 are identified as the signals RingQi, RQi, RQib. The Write clk signal is applied to a separate pad of the RFID tag ID device 400, such as can be externally applied to the RFID tag ID device 400 or can be applied internally from the wireless dosimeter chip-enabled tag 200 when the RFID tag ID device 400 is integrated with the wireless dosimeter chip-enabled tag 200, for example, to perform the writing task of writing the predetermined ID values to the e-Fuses 443. The clock amplitude for the writing operation is set to $V_{DD}$ of 1.2 V and not to 3.3 V, for example. The Write clk signal is grounded for the reading operation of the e-Fuses 443 of the fuse cell or memory cell 442.

Further, with reference to the table 600, the Data Write Enable signal is a constant "1" and is used only during the writing operation of writing the predetermined ID values to the e-Fuses 443. The Data Write Enable signal acts on the multiplexers (MUX's) of the RFID tag ID device 400 used to carry out the write or read tasks in reading from or writing to the e-Fuses 443 the predetermined ID values. The Data signal is an 8 bit pattern passed to the registers of the 8-bit shift register 430 serially before the writing operation of writing to the e-Fuses 443 the predetermined ID values. The C_OF signal enables or disables the access to the $V_{DDH}$ supply voltage. The C_OF signal is also necessary for enabling the write operation on each individual e-Fuse 443. The $V_{DDH}$ signal is set at 3.3 V for the writing operation only for writing to the e-Fuses 443 the predetermined ID values. The $V_{DDH}$ signal also isolates through the isolating component PMOS 510, the MOSFET T2, shown in FIG. 5A, the standard MOSFETs in the reference current source in the current reference component block 504 from possible damage. The $V_{DDH}$ signal also isolates the input VFuse of the clocked comparator 420 and any possible current path from the fuse cell block 442 shown in FIG. 5D during the writing operation for writing to the e-Fuses 443 the predetermined ID values. The GND signal is set to 0 for the read operation and the write operation of reading and writing the predetermined ID values to the e-Fuses 443, for example.

Figure 7:
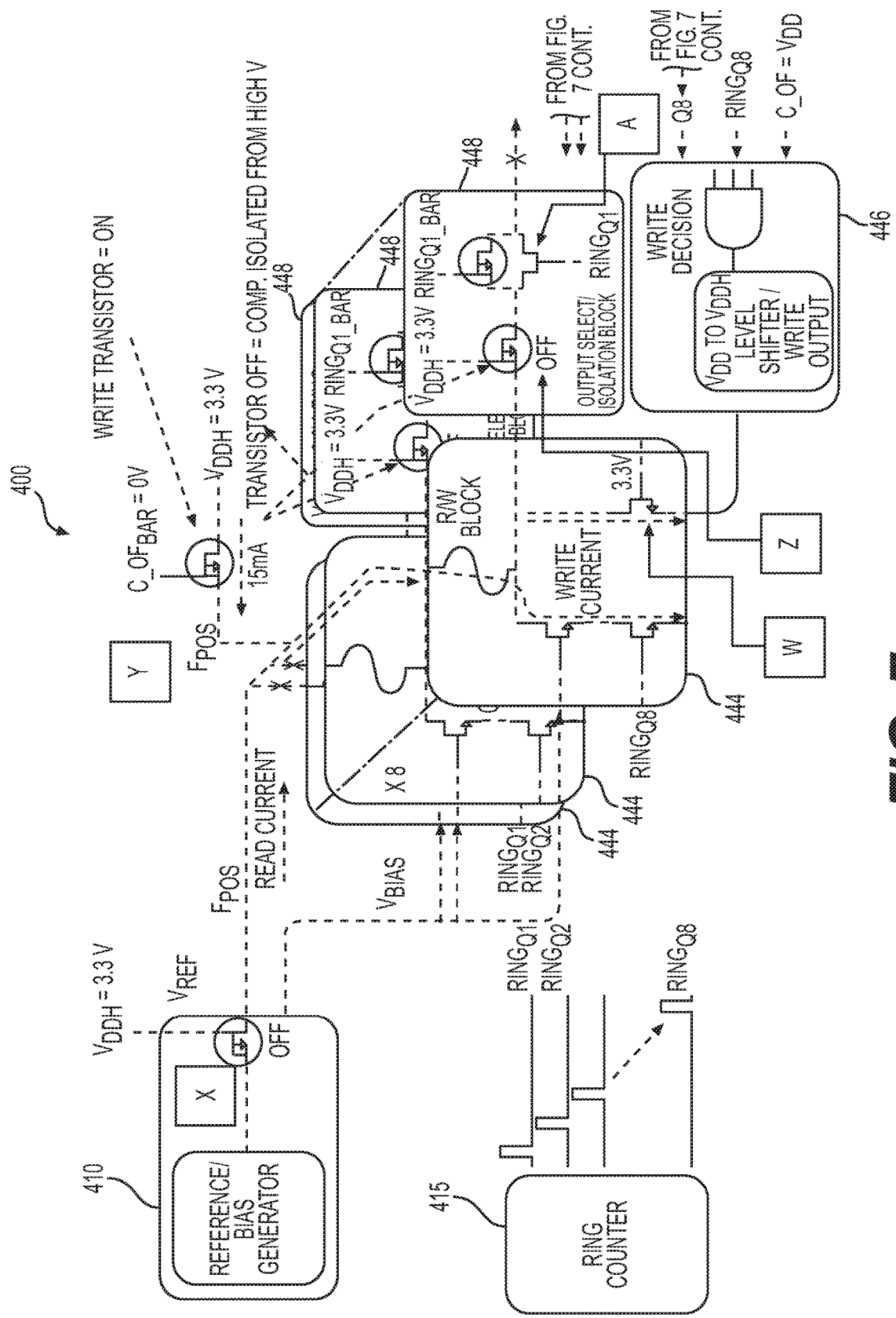
FIG. 7 shows a schematic block diagram of circuitry and a schematic circuit chip layout for embodiments of a RFID tag ID device of FIG. 4 illustrating circuitry associated with and embodiments of methods for a write operation for the non-volatile memory (NVM) e-Fuses of the memory cell or fuse cell for writing into the NVM memory the predetermined ID values corresponding to a RFID tag ID, according to the present invention.
Figure 7:
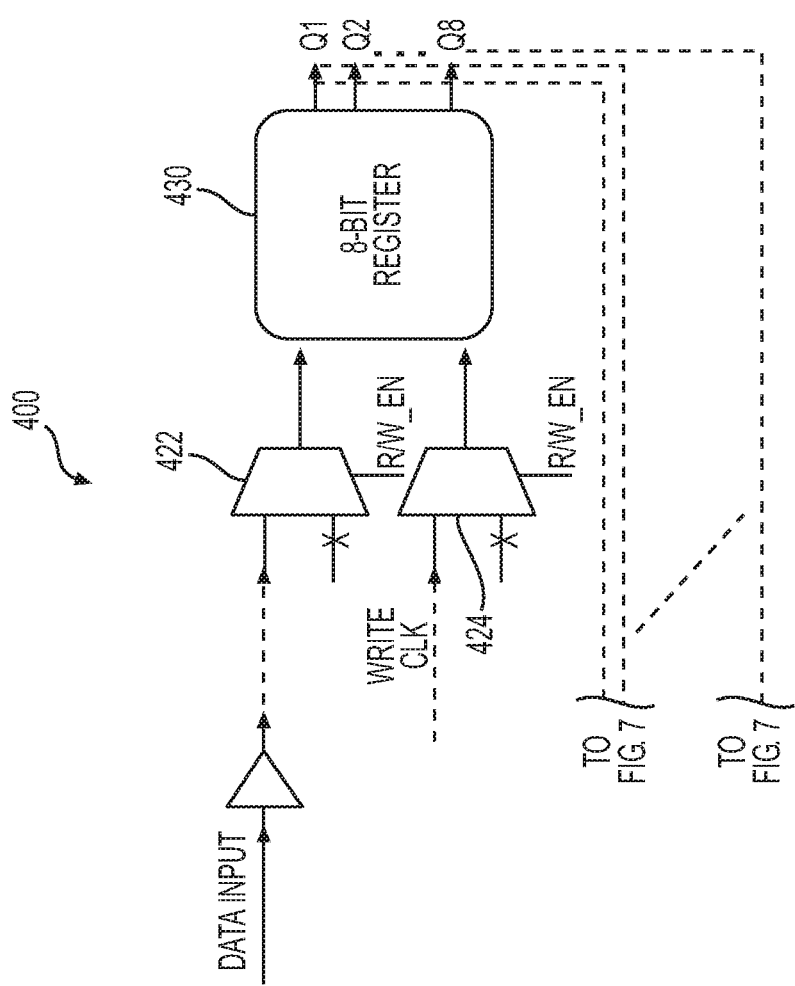

FIG. 7 shows a schematic block diagram of circuitry and a schematic circuit chip layout for embodiments of a RFID tag ID device 400 of FIG. 4 illustrating the write operation of writing the predetermined ID values to the e-Fuses 443 showing circuitry associated with and embodiments of methods for the write operation for the non-volatile memory (NVM) e-Fuses 443 of the fuse cell or memory cell 442 for writing into the NVM memory the predetermined ID values corresponding to a RFID tag ID, according to the present invention.

Continuing with reference to FIG. 7, as well as to FIGS. 4 and 5A-5E, an embodiment of the method for the write operation for writing the predetermined ID values to the e-Fuses 443 and components of the RFID tag ID device 400 involved in the write operation are described. The write operation involves circuitry and components of the RFID tag ID device 400 including the reference/bias generator 410, the ring counter 415, the read/write component block 444, the write decision component block 446, the output select/isolation block 448, the gates 422 and 424 and the 8 bit shift register 430, the function and operation of these components of the RFID tag ID 400 in relation to the write operation of the e-Fuses 443 are indicated in FIG. 7, for example.

Continuing with reference to FIGS. 4 and 7, in the write operation of FIG. 7, an external pad inputting an external clock signal with an amplitude of 1.2 V with a possible signal period of 400 µs was used in application of a clock signal to the RFID tag ID device 400. A faster clock signal might result in shorter writing time, but such faster clock signal, might not completely burn an e-Fuse 443 in writing the predetermined ID value to the e-Fuse 443. A longer clock time could be used, and a clock period value above 400 µs can be used to write the predetermined ID values to the non-charge-based memory components, the e-Fuses 443, of the memory cell or fuse cell 442, as can depend on the use, configuration or application of or for the RFID tag ID device 400, and should not be construed in a limiting sense. A voltage for $V_{DDH}$=3.3 V is applied to the RFID tag ID device 400 in various places for the write operation as indicated and shown in FIG. 7, for example.

In the output select/isolation block 448, the PMOS transistor 'Z' gets 3.3 V during the write operation. The PMOS transistor "Z" functions as a further isolating component to isolate the high writing voltage from getting to the low-voltage circuitry in the clocked comparator 420. Also, the output select/isolation block 448 desirably includes a PMOS/NMOS combination 'A' for the writing and reading operations. As can be seen from FIGS. 4 and 7, the Write CLK (W CLK) signal runs the 8-bit shift register 430 and the straight ring counter 415. The first 8 clock cycles are used to feed 8 bits of data (comprised of 0's and 1's) to the 8-bit shift register 430 while through the use of the "C_OF" signal, the rest of the RFID tag ID device 400 circuit components are not operating for this part of the write operation. After the first 8 clock cycles, the 8-bit shift register 430 is full with the data bits to be written into the e-Fuses as the predetermined ID values for the predetermined ID. They are located at each of the Q1 to Q8 signal lines from the 8-bit shift register 430. Then the next 8 clock cycles are used to write each value of Q1 to Q8 onto the e-Fuses 443.

In the write operation, the ring counter 415 sequentially creates a '1' value within "RingQ1" to "RingQ8" for the corresponding predetermined ID value, while the rest of the "Ring Q1" to "Ring Q8" signal values are 0's.

For example, the RingQ's created by the ring counter 415 work as follows: 10000000→01000000→00100000→00010000→00001000 →00000100→00000010→0 0000001.

Continuing with reference to FIGS. 4 and 7 for the write operation, the C_OF signal changes value to $V_{DD}$ at the beginning of the $9^{th}$ clock cycle and the data in each ring signal Q1 to Q8 are sent to the write decision component block 446 shown in FIGS. 4 and 7. The three signals of RingQ, Q, and C_OF are then together combined with an "AND" operation and if all of them are '1', then a "Write Fuse" command shown in FIG. 4 is applied to the NMOS in the read/write component block 444 in FIG. 7 which then lets a current, such as in a range of 10 mA to 15 mA flow through the $1^{st}$ e-Fuse 443 through the PMOS transistor 'Y' in FIG. 7. During the write operation, the MOSFETs in 'A', 'X' and 'Z' in FIG. 7 stop any high voltages of approximately 3.3 V to get to other parts of the RFID tag ID device 400 circuit which can get damaged by such voltage applied during the write operation.

The write operation of FIG. 7 then continues for the $2^{nd}$ e-Fuse 443, again the Ring RingQ2 signal is chosen with Q2 and the C_OF signal, and if the AND operation result is '0', nothing happens to the e-Fuse 443, such that the $2^{nd}$ e-Fuse 443 remains intact, having the corresponding predetermined ID value for an intact e-Fuse 443, and no current flows through PMOS 'Y' of FIG. 7. The write operation, as described herein, then continues sequentially for the $3^{rd}$ through the $8^{th}$ e-Fuses. After 8 cycles of the write operation for writing the predetermined ID values to the eight e-Fuses 443 for the predetermined ID, the RingQ signal has reached it last bit shown above (00000001) for the ring signal RingQ8 and, as such for an 8-bit memory, no more bits are left to be written to the e-Fuses 443, therefore, the write session or write operation has been completed for the e-Fuses 443 of the fuse cell or memory cell 442 providing the predetermined ID values for the predetermined ID that uniquely identifies the RFID tag. Also, the above write operation can be performed for any number of e-Fuses or bits as may be needed for the predetermined ID, as can depend on the use, configuration or application for the RFID tag ID device 400, and should not be construed in a limiting sense. In the write mode or write operation, the value of the $V_{DD}$ signal which operates all the logic components, such as the 8-bit shift register 430, the ring counter 415, and other component blocks of the RFID tag ID device 400 is desirably set to 1.2 V, for example.

Figure 8:
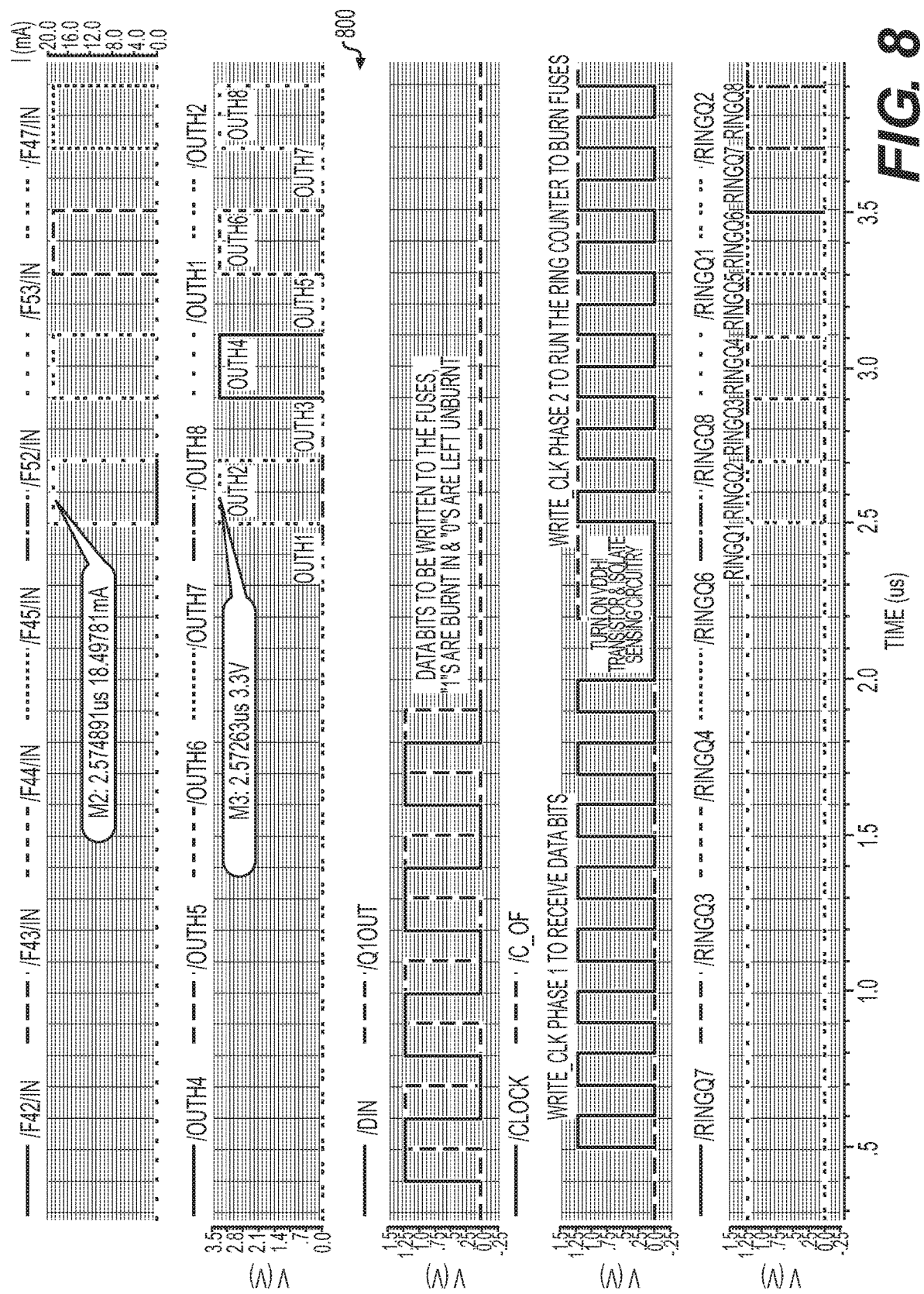
FIG. 8 is a graphic illustration of fuse writing operation sample signals plotted as voltage (V) versus time T in microseconds (µs) in embodiments of methods for a write operation to write predetermined ID values into the non-volatile memory (NVM) e-Fuses of the fuse cell or memory cell for embodiments of a RFID tag ID device of FIG. 4 for a corresponding RFID tag, according to the present invention.

FIG. 8 is a graphic illustration 800 of a fuse writing operation with sample signals plotted as voltage (V) versus time T in microseconds (µs) in embodiments of methods for a write operation to write predetermined ID values into the non-volatile memory (NVM) e-Fuses 443 of the fuse cell or memory cell 442 for embodiments of a RFID tag ID device 400 of FIG. 4 for a corresponding RFID tag, according to the present invention. The graphic illustration 800 of FIG. 8 demonstrates a sample write operation signal pattern for the RFID tag ID device 400 for the write operation as described in relation to FIG. 7. It can be seen from the graphic illustration 800 of FIG. 8 that 4 bits out of 8 bits for the e-Fuses 443 are being burnt by applying 3.3 V which allows a current of approximately ≈18.5 mA to pass through the e-Fuses one at a time in the sample write operation for writing the predetermined ID values to the exemplary eight e-Fuses 443 of the memory cell or fuse cell 442 corresponding to a predetermined ID for a RFID tag, for example.

FIG. 9 shows a schematic block diagram of circuitry and a schematic circuit chip layout for embodiments of a RFID tag ID device 400 of FIG. 4 illustrating circuitry associated with and embodiments of methods for the read operation of reading the predetermined ID values from the e-Fuses 443 showing circuitry associated with and embodiments of methods for the read operation for the non-volatile memory (NVM) e-Fuses 443 of the fuse cell or memory cell 442 for reading from the NVM memory the predetermined ID values corresponding to a RFID tag ID, according to the present invention.

Continuing with reference to FIG. 9, as well as to FIGS. 4 and 5A-5E, an embodiment of the method for the read operation for reading the predetermined ID values from the e-Fuses 443 and components of the RFID tag ID device 400 involved in the read operation are described. The read operation involves circuitry and components of the RFID tag ID device 400 including the reference/bias generator 410, the ring counter 415, the read/write component block 444, the output select/isolation block 448, the gates 422 and 424, the 90 degree(90°) read clock phase shifter 423, and the 8 bit shift register 430, the function and operation of these components of the RFID tag ID 400 in relation to the read operation of the e-Fuses 443 are indicated in FIG. 9, for example.

Continuing with reference to FIGS. 4 and 9, as well as with reference to FIGS. 5A, 5C and 5E, the sensing operation or reading operation of the predetermined ID values of the e-Fuses 443 from the memory cell or fuse cell 442 involves the circuit blocks shown in FIGS. 5A, 5C, and 5E in addition to a clock input such as provided through the gates 412, 422 and 424, the 90 degree(90°) read clock phase shifter 423, and the shift registers of the 8-bit shift register 430. Instead of relying on pre-charging the bit line directly connected to the e-Fuses 443, such as through access transistors, the read operation circuit topology of the RFID tag ID device 400 desirably pre-charges only the diffusion capacitances on nodes "X", "Y", "AA" and "BB", as indicated in FIG. 5E for the clocked comparator 420, prior to the sensing or reading operation of the predetermined ID values of the e-Fuses 443.

Also, another desirable benefit of the reading operation circuit topology for the clocked comparator 420, such as indicated in FIG. 5E, is that a relatively better or best switching (latching) performance can be achieved by using minimum size transistors. In such circuit topology, the pre-charger does not have to drive a large capacitor resulting from many metal routings connecting the e-Fuse nodes in parallel. Other benefits of using the circuit topology of FIG. 5E for the clocked comparator 420 are facilitating consuming zero static power and directly producing rail-to-rail outputs, for example. Since this circuit topology relies on a voltage gain resulting from the flow of charge from CAA and CBB, the input offset must be a minimum offset in order to increase the read sensitivity (i.e. the minimum input voltage difference detectable). Such desirable circuit topology for the clocked comparator 420, such as a clocked strong arm latch comparator, desirably can be implemented on a relatively symmetric integrated circuit layout for the clock comparator 420, such as illustrated in FIG. 5F, for example.

Various considerations were taken into account in the desirability of the sensing topology of the RFID tag ID device 400 for the reading or sensing topology for the read operation of the e-Fuses 443. It was determined that a few resistors used in the current reference circuit block 504 of the reference/bias generator 410 and in the e-Fuse reference resistor 506 desirably are of high or relatively high accuracy type. Such high accuracy poly-resistors typically have a smaller process variation but also occupy a much larger footprint than low accuracy poly-resistors.

In choosing the value of the reference resistor 506, as per the technology documentations, a typical eFuse would have a resistance ≥5 kiloohms (kΩ). Therefore, the reference resistor 506 was desirably set at 2.5 kΩ, the approximate midpoint between 150 ohms (Ω) and 5 kΩ, for example. Monte Carlo simulations were performed to determine the trip point, or the closet value, to the reference resistor 506, correctly detectable. Also, a relatively conservative design was considered for the reference resistor 506 in relation to power consumption. Typically, the lower the reference resistor value, the higher the bias current running through the reference resistor, such as the reference resistor 506 and the e-Fuses, such as the e-Fuses 443. While it is possible to assume a higher programmed e-Fuse resistance, it is desirable to provide for an e-Fuse resistance that facilitates a robust and reliable operation, as well as facilitates minimizing the footprint and power consumption for the RFID tag ID device 400, for example, particularly as to the desirability of low-power wireless operation of a RFID tag for wireless dosimeter measurements, for example.

Continuing with reference to FIGS. 4 and 9, as well as with reference to FIGS. 5A, 5C and 5E, the read operation of reading the predetermined ID values of the e-Fuses 443 is described in more detail. For the "read" operation or "sense" operation, desirably the signal $V_{DDH}$ C_OF=0.0 V or just the common ground of the chip including the RFID tag ID device 400. This facilitates ensuring that the PMOS 'Y' is "OFF" or blocked, the PMOS 'X' is "ON" or conducting and the PMOS 'Z' is "ON" or conducting, as indicated in FIG. 9. Also, the write decision component block 446 is disabled and the NMOS 'W' indicated by the numeral 409 in FIG. 5D is "OFF", as indicated in FIG. 9. Further, the Read CLK" or "R CLK" signal for the read operation is applied from an external pad as indicated in FIGS. 4 and 9, or the Read CLK" or "R CLK" signal can be applied internally from the wireless dosimeter chip-enabled tag 200, for example, as well as the "W CLK" or "Write Clk" signal for the write operation is disabled, such as by being grounded, since the "W CLK" or "Write Clk" signal is not utilized for the read operation, as the write operation, in the case of e-Fuses, only happens during the programming of the e-Fuses 443, and the predetermined ID values are read, not written, during the reading operation, for example.

Also, in the read operation, the "R CLK" signal is sent to the 90 degree(90°) read clock phase shifter 423 which generates the comparator clock and the required clock to the 8-bit shift register 430, as a shift register clock signal, which holds the 8-bit e-Fuse 443 values to be sent at the end of the read cycle. The 90 degree(90°) read clock phase shifter 423 desirably facilitates creating a delay between the clocked comparator 420 and the 8-bit shift register 430 so that the clocked comparator 420 has enough time to compare the e-Fuse 443 voltage value to the $V_{REF}$ voltage and then save the corresponding e-Fuse 443 voltage value into the 8-bit shift register 430. If the same clock was used to perform both tasks, then the 8-bit shift register 430 would likely save a random (wrong bit value) and, hence, an error would likely occur in the read operation of the e-Fuses 443.

During the read operation, the write decision component block 446 is completely off. For the first 8 read clock cycles, the 8-bit shift register 430 is filling up with e-Fuse 443 values, and for the next 8 cycles, the e-Fuse 443 values can be collected from the Q8 signal output, such as from a Q8 signal output pad, from the shift register 430, such as in a series read operation, for example. Also, if all 8 bits corresponding to the signals Q1 to Q8 are monitored, the memory value can be read in a parallel format from corresponding Q1 to Q8 signal outputs, such as from the corresponding Q1 to Q8 signal output pads, of the shift register 430 after the first 8 clock cycles for the parallel operation, for example. The embodiment of the circuit of the comparator 420 shown in FIG. 5E is desirably symmetrically laid out in an integrated circuit chip, as indicated and illustrated in FIG. 5F, in view of relatively high sensitivity requirements, such as for a relatively low-power RFID tag for wireless dosimeter applications, for example.

Figure 10:
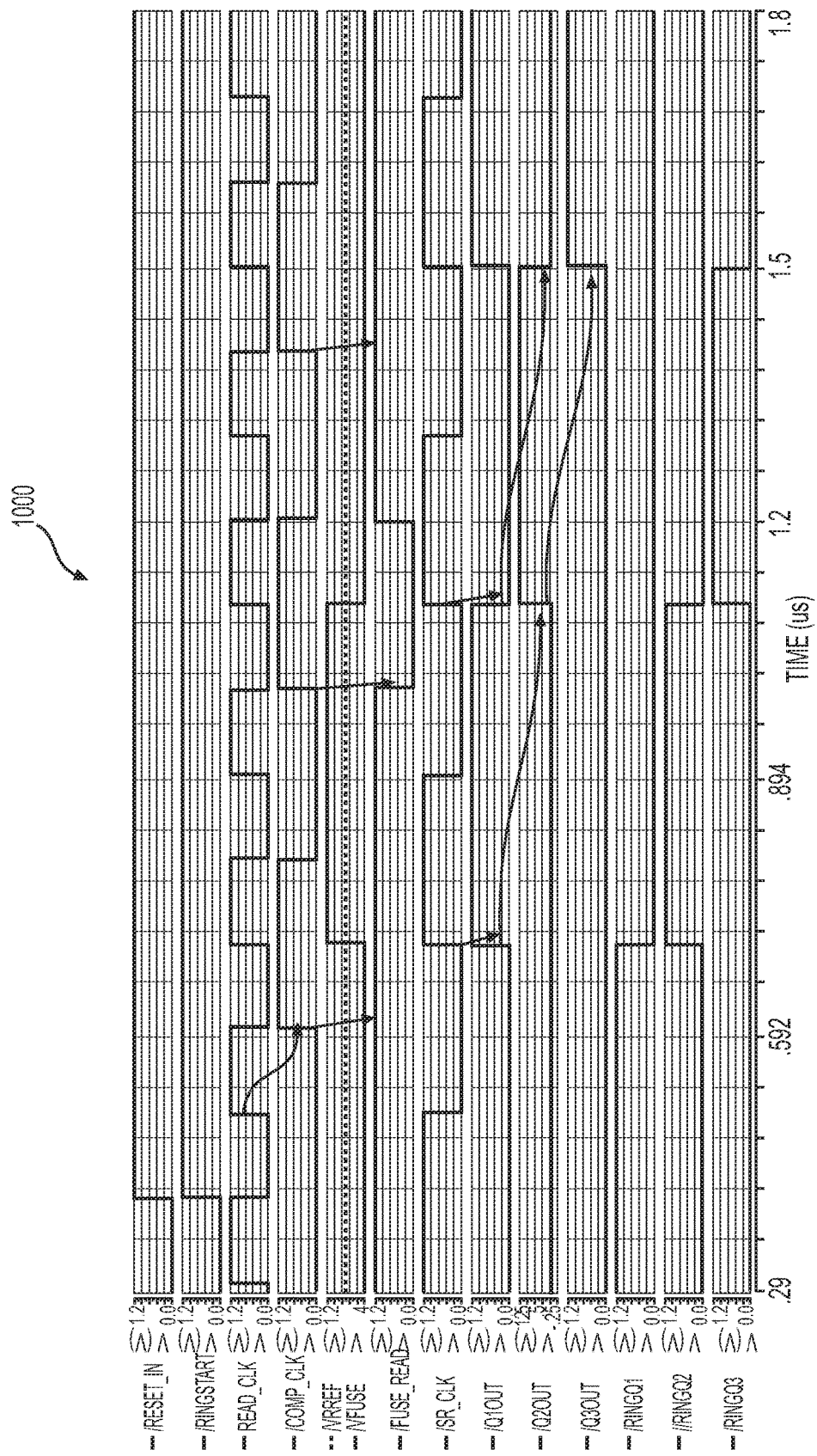
FIG. 10 is a graphic illustration of a fuse read operation signal flow plotted as voltage in volts (V) versus time T in microseconds (µs) in embodiments of methods for a read operation to read the predetermined ID values from the non-volatile memory (NVM) e-Fuses of the fuse cell for embodiments of a RFID tag ID device of FIG. 4 for a corresponding RFID tag ID, according to the present invention.

FIG. 10 is a graphic illustration of a fuse read operation signal flow for reading the predetermined ID values of the e-Fuses 443 plotted as voltage in volts (V) versus time T in microseconds (μs) in embodiments of methods for a read operation, as described in relation to FIG. 4, FIGS. 5A, 5C and 5E and 9, the read operation to read the predetermined ID values of a predetermined ID of a RFID tag from the non-volatile memory (NVM) e-Fuses 443 of the fuse cell or memory cell 442 for embodiments of a RFID tag ID device 400 of FIG. 4, according to the present invention.

Continuing with reference to FIG. 10, there is illustrated a graphic illustration 1000 of an embodiment for a logical signal flow for a read operation of the predetermined ID values stored in the memory cell or fuse cell 442 of the RFID tag ID device 400. As illustrated from FIG. 10, with reference to FIG. 4, FIGS. 5A, 5C and 5E and 9, as the Comp clk signal goes HIGH, the pre-charging PMOS's of the reference/bias generator 410 turn off and the evaluation period begins by turning on the NMOS as shown in clocked strong arm latch comparator 420 indicated in FIG. 5E. The two signals being compared are at the inputs of the differential pair of signals $V_{REF}$ and $V_{FUSE}$, and the signals $V_{REF}$ and $V_{FUSE}$. are set up, as indicated from FIG. 10, to facilitate a relatively stable signal read operation of the predetermined ID values of the e-Fuses 443.

In the read operation of FIG. 10, as the read clk signal rises, the Comp clk signal rises and, since the voltage value of $V_{FUSE}$ is lower than that of $V_{REF}$, there is no transition in the Fuse Read signal. As the first SR clk signal positive signal edge arrives, it passes the "1" to the first register Q1out of the shift register 430. This process during the RingQ1 signal enables a first e-Fuse 443 to be read. If $V_{FUSE}$ is less than <$V_{REF}$, then the e-Fuse 443 has been blown (high resistance) which is interpreted as a logical "1", otherwise if the e-Fuse 443 has not been blown (intact) it is a logical "0" that provides the corresponding predetermined ID value for the corresponding e-Fuse 443.

The above read operation continues for the remaining e-Fuses 443 in the fuse cell or memory cell 442 by repeating the above described operation for the other RingQ signals, RingQ2 to Ring Q8, for each of the remaining second through eighth e-Fuses 443. As the next e-Fuse 443 is read, the ring Q signal for the previously read e-Fuse 443 goes low and the next to be read e-Fuse 443 ring Q signal goes high, such as the RingQ1 signal going low and the RingQ2 signal going high for reading a second e-Fuse 443. If the voltage value $V_{FUSE}$ is less than <$V_{REF}$ for the e-Fuse 443 being read, then the e-Fuse 443 has been blown (high resistance) which is interpreted as a logical "1", otherwise if the e-Fuse 443 has not been blown (intact) it is a logical "0" for the e-Fuse 443 being read, thereby providing the corresponding predetermined ID value for the corresponding e-Fuse. The reading operation continues as described until all values of the e-Fuses 443 are determined that provide the corresponding predetermined ID for the RFID tag ID device associated with a RFID tag.

Also, it is noted that as the supply voltage is reduced from the nominal 1.2 V to 0.53 V for the RFID tad ID device 400, the difference in voltage between $V_{FUSE}$ and $V_{REF}$ reduces to the point where reliable read operations are not likely. For the read operation, the current source circuit of the current reference component block 504 shown in FIG. 5A advantageously facilitates maintaining a difference between the two signal voltages $V_{FUSE}$ and $V_{REF}$ within the supply range to facilitate a reliable read operation of the predetermined ID values of the e-Fuses 443, for example.

Figure 11:
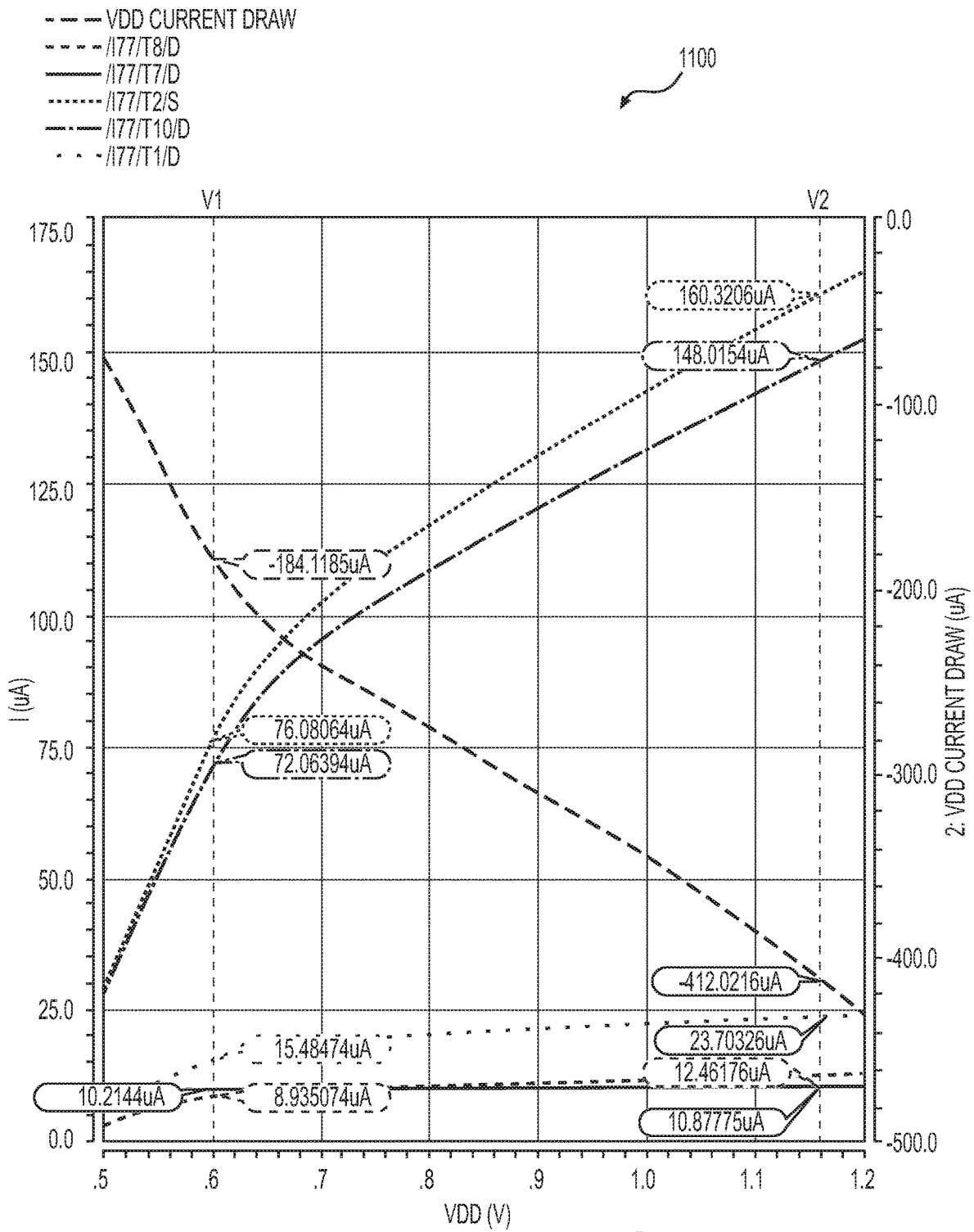
FIG. 11 is a graphic illustration of direct current (DC) current flow through the current source block of the reference/bias generator for embodiments of a RFID tag ID device of FIG. 4 indicating the current in microamperes (µA) versus the voltage $V_{DD}$ (V) for reading the predetermined ID value of a low resistance, i.e., connected, e-Fuse of the memory cell or fuse cell, according to the present invention.
Figure 12:
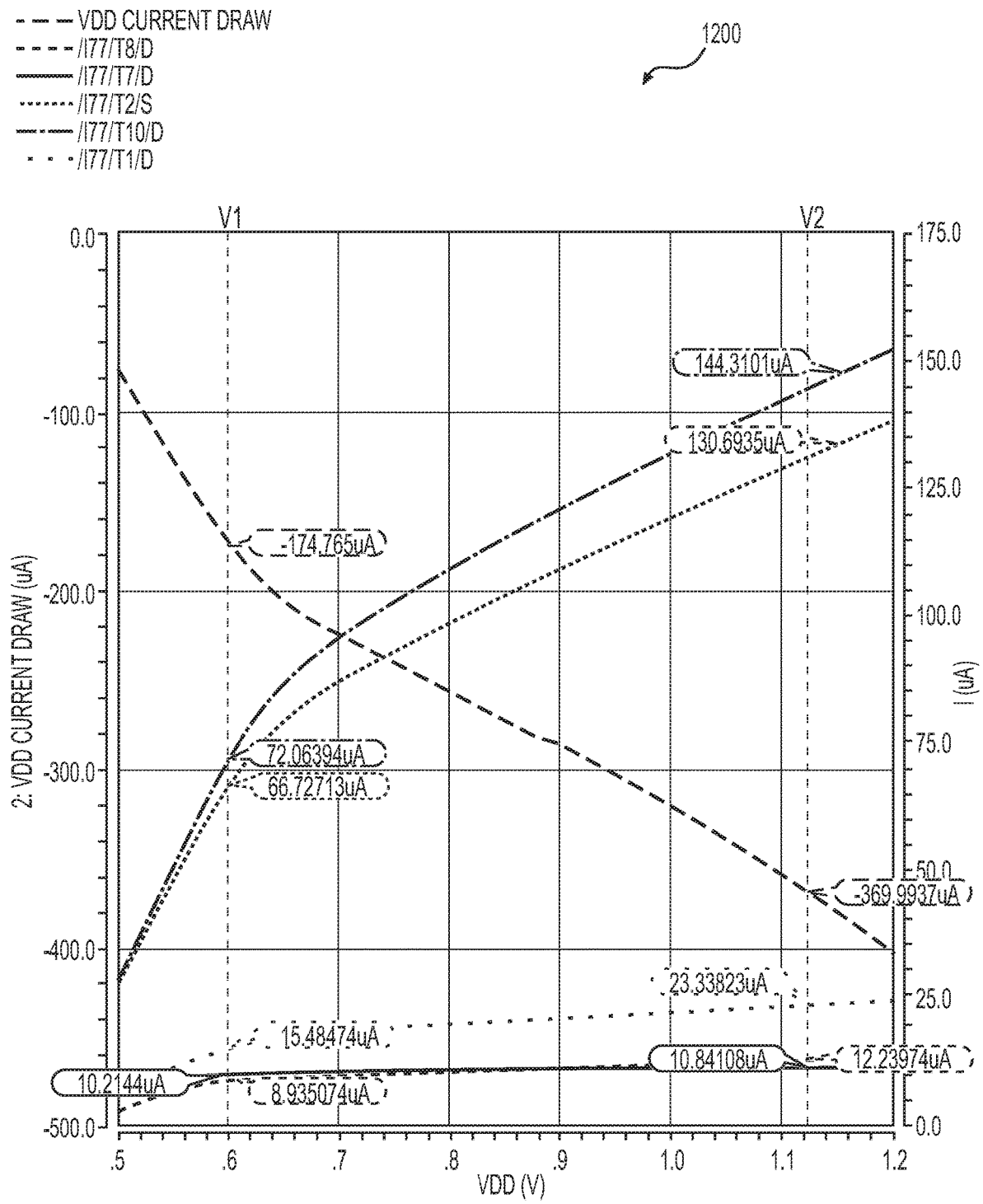
FIG. 12 is a graphic illustration of direct current (DC) current flow through the current source block of the reference/bias generator for embodiments of a RFID tag ID device of FIG. 4 indicating the $V_{DD}$ current draw in microamperes (µA) versus the voltage $V_{DD}$ (V) for reading the predetermined ID value of a high resistance, i.e., blown or not connected, e-Fuse of the memory cell or fuse cell, according to the present invention.

Referring now to FIGS. 11-14, FIG. 11 is a graphic illustration 1100 of direct current (DC) current flow through the current source reference component block 504 of the reference/bias generator 410 for embodiments of a RFID tag ID device 400 of FIG. 4 indicating the current in microamperes (μA) versus the voltage $V_{DD}$ (V) for reading the predetermined ID value of a low resistance, i.e., connected, e-Fuse 443 of the fuse cell or memory cell 442, according to the present invention. FIG. 12 is a graphic illustration 1200 of direct current (DC) current flow through the current source reference component block 504 of the reference/bias generator 410 for embodiments of a RFID tag ID device 400 of FIG. 4 indicating the $V_{DD}$ current draw in microamperes (μA) versus the voltage $V_{DD}$ (V) for reading the predetermined ID value of a high resistance, i.e., blown or not connected, e-Fuse 443 of the fuse cell or memory cell 442, according to the present invention.

Figure 13:
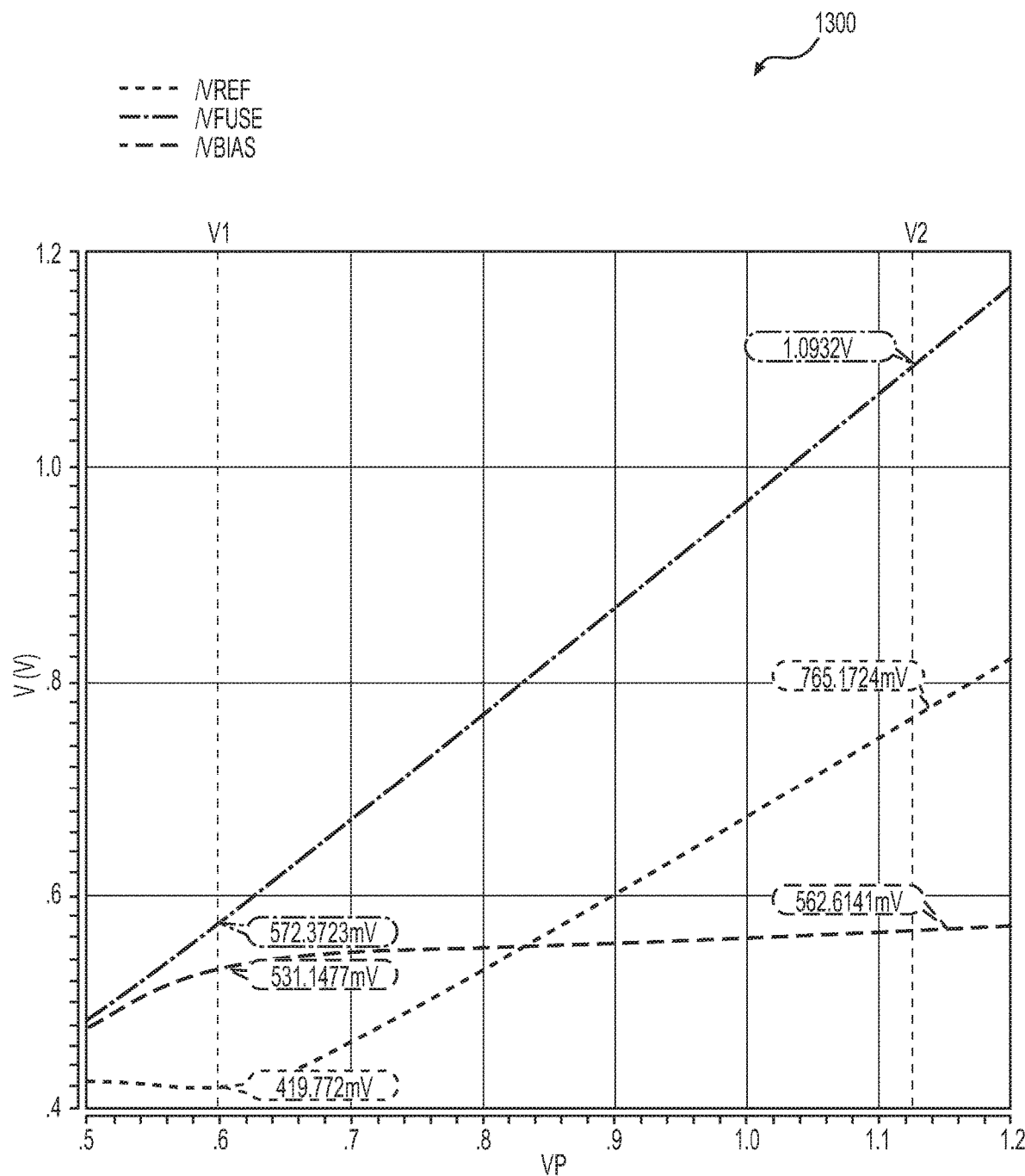
FIG. 13 is a graphic illustration of DC values of $V_{REF}$, $V_{FUSE}$, and $V_{BIAS}$ for embodiments of a RFID tag ID device of FIG. 4 indicating the voltage (V) versus the voltage $V_P$ (V) for of a low resistance, i.e., connected, e-Fuse of the memory cell or fuse cell as per $V_{DD}$ sweep, according to the present invention.
Figure 14:
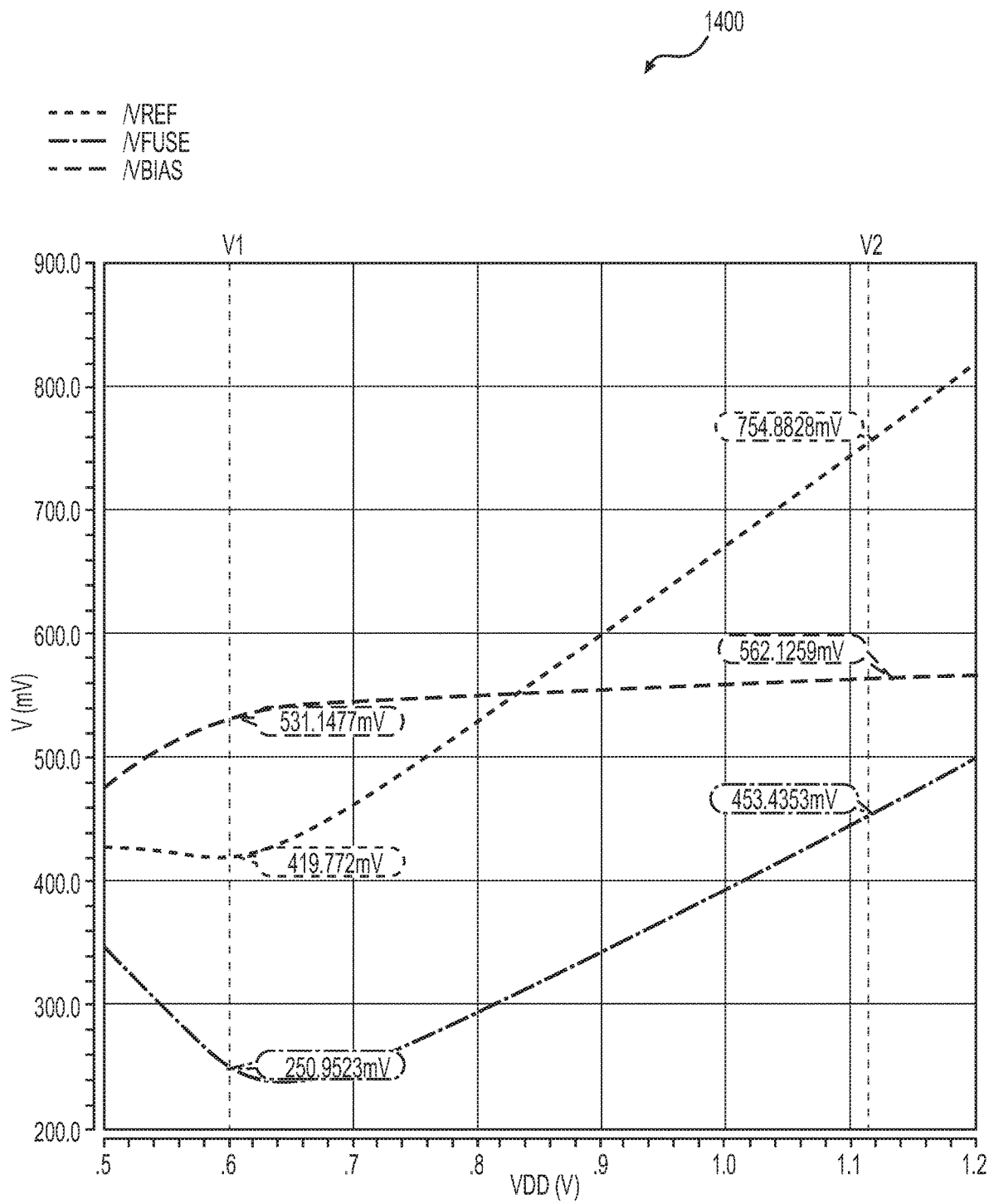
FIG. 14 is a graphic illustration of DC values of $V_{REF}$, $V_{FUSE}$, and $V_{BIAS}$ for embodiments of a RFID tag ID device of FIG. 4 indicating the voltage in millivolts (mV) versus the voltage $V_{DD}$ (V) for of a high resistance, i.e., blown or not connected, e-Fuse of the memory cell or fuse cell as per $V_{DD}$ sweep, according to the present invention.

Continuing with reference to FIGS. 13 and 14, FIG. 13 is a graphic illustration 1300 of direct current (DC) voltage values of $V_{REF}$, $V_{FUSE}$, and $V_{BIAS}$ for embodiments of a RFID tag ID device 400 of FIG. 4 indicating the voltage (V) versus the voltage $V_P$ (V) for a low resistance, i.e., connected, e-Fuse 443 of the fuse cell or memory cell 442 as per $V_{DD}$ sweep, according to the present invention. FIG. 14 is a graphic illustration 1400 of direct current (DC) voltage values of $V_{REF}$, $V_{FUSE}$, and $V_{BIAS}$ for embodiments of a RFID tag ID device 400 of FIG. 4 indicating the voltage in millivolts (mV) versus the voltage $V_{DD}$ (V) for of a high resistance, i.e., blown or not connected, e-Fuse 443 of the fuse cell or memory cell 442 as per $V_{DD}$ sweep, according to the present invention.

The information in the graphic illustrations 1100, 1200, 1300 and 1400 of FIGS. 11-14 are a result of the read operation described in relation to FIG. 4, FIGS. 5A, 5C and 5E and 9. A significant observation indicated from the graphic illustrations 1100, 1200, 1300 and 1400 is that regardless of the supply voltage change $V_{DD}$, the voltages $V_{REF}$ and $V_{FUSE}$ stay separated from each other, as is desirable for the read operation of the e-Fuses 443, as described.

Also, the graphic illustrations 1100, 1200, 1300 and 1400 of FIGS. 11-14 were derived from post-layout simulations since real device measurements would require access to internal nodes on chip for the RFID tag ID device 400. However, any results, such as voltage or current measurements described, other than the above mentioned simulations were based on real device measurements for the RFID tag ID device 400 and match the simulation results. Consequently, the simulation results for the graphic illustrations 1100, 1200, 1300 and 1400 of FIGS. 11-14 can also be considered as device measurement values for the RFID tag ID device 400, for example.

As described, individual transistors' DC current values for the RFID tag ID device 400 are shown in FIG. 11 for the case of a "connected" e-Fuse 443 and those for a "blown" e-Fuse 443 are shown in FIG. 12. FIGS. 13 and 14 illustrate the difference between $V_{REF}$ and $V_{FUSE}$ as the supply voltage changes for a connected e-Fuse 443 and a blown e-Fuse 443, respectively. As can be seen, except for the 160.3206 µA curve and the 148.015 µA curve of FIG. 11 and the 144.310 µA curve and the 130.6935 µA curve of FIG. 12 all the other currents in FIGS. 11 and 12 are substantially unchanged throughout the range of supply voltages for the RFID tag ID device 400. The −184.118 µA curve in FIG. 11 and the −174.765 µA curve in FIG. 12 illustrate the entire chip's current draw for the RFID tag ID device 400. The transistors' currents in FIG. 11 correspond with the transistors in reference/bias generator 410 of FIG. 4 illustrated in more detail in FIG. 5A.

As illustrated from FIGS. 11 and 12, the current curves for the "T2" and "T10" transistors of the reference/bias generator 410 of FIG. 4 and FIG. 5A are not constant with supply voltage. The transistor "T10"'s gate is biased internally which would make it draw current independent of the supply much like other transistors in the circuit and, therefore, instead of using a PMOS transistor at a location of the reference resistor 506, the reference resistor 506 is used instead, as illustrated in FIG. 5A.

Use of the reference resistor 506 facilitates that the current in that branch of the reference/bias generator 410 is not perfectly independent of the supply. If a PMOS is utilized in the reference/bias generator 410 instead of the reference resistor 506, then $V_{REF}$ would stay unchanged or substantially unchanged with supply voltage but, on the other hand, the fuse circuit structure for the fuse or memory cell 442 would not be an exact or substantially exact mirror of that of the reference. Moreover, with a PMOS used in place of the reference resistor 506 in the reference/bias generator 410, $V_{REF}$ would drop to only 10's of millivolts where there would be no comparison between each e-Fuse 443 and the reference circuit provided by the reference/bias generator 410. Also, a reference resistor (2.5 kΩ) mid-way in value between a connected e-Fuse 443 (100Ω) and a blown e-Fuse 443 (5 kΩ and more) would likely result in a more accurate comparison than a reference PMOS if used in place of the reference resistor 506, for example.

Various iterations of post-layout Monte Carlo simulations and corner plus temperature simulations were performed on embodiments of the RFID tag ID device 400 in order to arrive at an optimal or relatively best possible solution to the reference versus fuse resistor comparison. This design iteration of use of the reference resistor 506 was to facilitate achieving a correct and optimum (in term of power consumption) operation of the memory chip as a whole rather than maintaining the current in the reference and fuse branches. Such limitation arises from the fact that a common branch feeds both the sensing and writing currents to the individual e-Fuse 443, which means in order to pass 15 mA of current through a PMOS, sizes above 100 µm would be typically needed for each e-Fuse 443 which would likely not be efficient in area.

The memory block including the memory cell or fuse cell 442 of the RFID tag ID device 400 was successfully tested using a Digilent Analog Discovery which generates the necessary input signals to program or sense the memory. Also, the robust operation of the memory block including the memory cell or fuse cell 442 of the RFID tag ID device 400 was tested under X-ray radiation using the Raycell MK2 blood irradiator.

The packaged memory chip including the RFID tag ID device 400 was installed on a breadboard with all the input signals attached via a CAT 7 shielded cable and passed through the opening from behind the Raycell MK2 irradiator machine. While under radiation, the memory block including the memory cell or fuse cell 442 of the RFID tag ID device 400 was read and the correct bit stream previously programmed on the chip for the RFID tag ID device 400 was output. The supply for the test was kept at the minimum of approximately ~0.5 V, and a total radiation dose of 150 Gray (Gy) was applied by the Raycell MK2 irradiator machine during which the memory chip including the memory cell or fuse cell 442 of the RFID tag ID device 400 was read continuously to ensure correct operation.

Also an ionizing radiation exposure session of the memory chip including the memory cell or fuse cell 442 of the RFID tag ID device 400 for approximately 20 minutes using the Raycell MK2 irradiator machine did not deter the read operation of the RFID tag ID device 400 integrated circuit chip, thereby indicating its suitable use for a low power non-volatile non-charge-based variable supply RFID tag memory, such as suitable for use for a RFID tag for a wireless dosimeter for measuring radiation dose delivered to an object or product, such as to a blood bag, for example.

Embodiments of the RFID tag ID device and the low power non-volatile non-charge-based variable supply RFID tag memory described herein desirably facilitate various RFID tag applications, such as for wireless dosimetry measurements and other wireless identification applications. The RFID tag ID device, such as the RFID tag ID device 400, and embodiments of a low power non-volatile non-charge-based variable supply RFID tag memory described herein, provide a low-power or an ultra-low power, variable supply, non-charge-based, permanent memory cell that stores an identification bit string therein as an ID, the memory cell being on an integrated circuit chip to be used for identification of the associated chip for wireless transmission and reception related to identification of the chip, such as for identification of a dosimeter tag associated with a product or object being irradiated, such as a blood bag.

The RFID tag ID device, such as the RFID tag ID device 400, and embodiments of a low power non-volatile non-charge-based variable supply RFID tag memory described herein are crucial or highly desirable to the operation of an RFID dosimeter tag, such as the necessity to be able to identify a blood bag from another blood bag, for example.

Also, embodiments of the RFID tag device, such as the RFID tag ID device 400, and embodiments of a low power non-volatile non-charge-based variable supply RFID tag memory, described herein desirably provide a low power, variable supply, non-charge-based, permanent memory cell for wireless communication that can enable the RIFD tag to send information back to a reader and, by having the predetermined ID values stored in the non-charged based memory components, such as the e-Fuses 443, a predetermined ID of the RFID tag corresponding to the predetermined ID values of the non-charged based memory components, such as the e-Fuses 443, is provided to the reader associated with the product or object having the RIFD tag, such as a blood bag. Embodiments of the RFID tag ID device 400 desirably address a potential problem of where there is no specific identification of the chips associated with a product or object, for example, which can occur once a read data command is sent to the RFID tags, in that all of the chips likely would respond back at the same time as can cause jamming or possible error in reading back data transmitted, such as the dosimetry data, for example.

Further, embodiments of the RFID tag device, such as the RFID tag ID device 400, and embodiments of a low power non-volatile non-charge-based variable supply RFID tag memory, described herein address challenges faced in designing a robust RFID low power, variable supply, non-charge-based, permanent memory cell that can be on an integrated circuit chip for various wireless applications, such as for use as wireless dosimetry tags.

Additionally, methods for reading and writing the predetermined ID values to the non-charge based memory of the RFID tag ID device, such as for use in identifying the object or product to be irradiated, such as a blood bag, or for other applications for RFID tags, for example, are provided through the read and write operations in reading and writing the predetermined ID values to the non-charge-based memory of the RFID tag ID device using the components and structure of embodiments of the RFID tag device, such as the RFID tag ID device 400, and embodiments of a low power non-volatile non-charge-based variable supply RFID tag memory, described herein.

It is to be understood that the present invention is not limited to the embodiments described above, but encompasses any and all embodiments within the scope of the following claims.

We claim:

1. A wireless chip-enabled tag, comprising:
 a processor to control operation of the wireless chip-enabled tag, the processor having an associated memory to store programs, instructions or data for operation of the wireless chip-enabled tag;
 an oscillator communicatively associated with the processor, the oscillator to generate signals for operation of the wireless chip-enabled tag;
 a demodulator communicatively associated with the processor to demodulate a received amplitude-shift keying (ASK) signal, the ASK signal including a received identification (ID);
 a decoder communicatively associated with the processor and with the demodulator, the decoder to decode the received ASK signal and the received ID, the wireless chip-enabled tag configured to compare the received ID to a predetermined ID corresponding to the wireless chip-enabled tag;
 a modulator communicatively associated with the processor to modulate and format an information or a data signal for transmission from the wireless chip-enabled tag;
 a Radio Frequency Identification (RFID) tag ID device communicatively associated with the processor, the RFID tag ID device configured for wireless powering by power provided by the received ASK signal, and the RFID tag ID device including a low power non-volatile non-charge-based memory including a plurality of non-charge-based memory components, each non-charge-based memory component being configured to be programmed to store a corresponding predetermined ID value forming a part of the predetermined ID for the wireless chip-enabled tag, the RFID tag ID device including a reference/bias generator configured to provide a reference voltage for comparison with a voltage indicated by a corresponding one of the plurality of non-charge-based memory components to determine the stored corresponding predetermined ID value, and the reference/bias generator configured to provide suitable voltage and current for write and read operations for each non-charge-based memory component to respectively write to and read from each non-charge based memory component the corresponding predetermined ID value and minimize voltage fluctuations resulting from the wireless powering of the RFID tag ID device detrimental to operation of the RFID tag ID device; and
 a flexible antenna communicatively associated with the processor configured to at least receive the ASK signal including the received ID and to transmit to a receiver at least one of the predetermined ID, the information or the data signal when the received ID matches the predetermined ID stored in the RFID tag ID device of the wireless chip-enabled tag.

2. The wireless chip-enabled tag of claim 1, wherein:
 each of the plurality of non-charge-based memory components is an electronic fuse (e-Fuse).

3. The wireless chip-enabled tag of claim 1, wherein:
 the wireless chip-enabled tag is a wireless dosimeter chip-enabled tag for measuring a received dose of radiation delivered to a product or an object associated with the wireless dosimeter chip-enabled tag, and
 the wireless dosimeter chip-enabled tag further comprises:
 a radiation sensor communicatively associated with the processor configured to sense an amount of the radiation delivered to the product or the object, and
 the information transmitted by the flexible antenna includes the amount of the radiation delivered to the product or the object.

4. The wireless chip-enabled tag of claim 3, wherein:
 the wireless dosimeter chip-enabled tag is associated with a blood bag and the product or the object comprises blood.

5. The wireless chip-enabled tag of claim 4, wherein:
 each of the plurality of non-charge-based memory components is an electronic fuse (e-Fuse).

6. The wireless chip-enabled tag of claim 3, wherein:
 each of the plurality of non-charge-based memory components is an electronic fuse (e-Fuse).

7. The wireless chip-enabled tag of claim 3, wherein:
 the wireless dosimeter chip-enabled tag further comprises:
 a temperature sensor communicatively associated with the processor to sense the temperature of the product or the object, and
 the information transmitted by the flexible antenna further includes the sensed temperature of the product or the object.

8. The wireless chip-enabled tag of claim 7, wherein:
 the wireless dosimeter chip-enabled tag is associated with a blood bag and the product or the object comprises blood.

9. The wireless chip-enabled tag of claim 8, wherein:
 each of the plurality of non-charge-based memory components is an electronic fuse (e-Fuse).

10. The wireless chip-enabled tag of claim 7, wherein:
each of the plurality of non-charge-based memory components is an electronic fuse (e-Fuse).

\* \* \* \* \*